(12) United States Patent
Zhang et al.

(10) Patent No.: US 12,328,999 B2
(45) Date of Patent: Jun. 10, 2025

(54) ANTI-CORROSION CIRCUIT, ELECTROSTATIC DISCHARGE PROTECTION CIRCUIT, ARRAY SUBSTRATE AND ELECTRONIC DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Bo Zhang, Beijing (CN); Xiangdan Dong, Beijing (CN); Junxi Wang, Beijing (CN); Yulong Wei, Beijing (CN); Rong Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 937 days.

(21) Appl. No.: 17/433,481

(22) PCT Filed: Apr. 23, 2020

(86) PCT No.: PCT/CN2020/086443
§ 371 (c)(1),
(2) Date: Aug. 24, 2021

(87) PCT Pub. No.: WO2021/212421
PCT Pub. Date: Oct. 28, 2021

(65) Prior Publication Data
US 2022/0344439 A1 Oct. 27, 2022

(51) Int. Cl.
*H10K 59/131* (2023.01)
*H10D 89/60* (2025.01)
*H10K 59/121* (2023.01)

(52) U.S. Cl.
CPC ............ *H10K 59/131* (2023.02); *H10D 89/60* (2025.01); *H10K 59/1213* (2023.02)

(58) Field of Classification Search
CPC .............. H10K 59/131; H10K 59/1213; H01L 27/0248
See application file for complete search history.

(56) References Cited

U.S. PATENT DOCUMENTS 5,818,086 A * 10/1998 Lin ..................... H01L 27/0248
257/355
6,479,883 B1 * 11/2002 Chen ................... H01L 27/0266
257/357

(Continued)

FOREIGN PATENT DOCUMENTS

| CN | 1350201 A | 5/2002 |
| CN | 107004774 A | 8/2017 |

(Continued)

OTHER PUBLICATIONS

International Search Report and English translation for corresponding International Application No. PCT/CN2020/086443, dated Jan. 8, 2021. 12 pages.

*Primary Examiner* — Lex H Malsawma
(74) *Attorney, Agent, or Firm* — LEASON ELLIS LLP

(57) ABSTRACT

An anti-corrosion circuit, an array substrate and an electronic device are provided. The array substrate includes: source signal lines, provided in the display area, extending along a first direction and arranged sequentially along a second direction; a first power bus line, provided in the peripheral area and including a main body portion extending along the second direction; an electrostatic discharge protection circuit, provided on a side of the main body portion away from the display area and electrically connected to the source signal lines, and including first sub-signal lines and second sub-signal lines. The first sub-signal lines and the (Continued)

second sub-signal lines extend along the second direction and are alternately arranged along the first direction, and the main body portion is adjacent to one first sub- signal line, and electrical property of the first power bus line is the same as electrical property of the one first sub-signal line.

18 Claims, 9 Drawing Sheets

(56) References Cited

U.S. PATENT DOCUMENTS

| | | | |
|---|---|---|---|
| 7,012,304 B1* | 3/2006 | Dabral | H01L 27/0255 |
| | | | 257/357 |
| 7,148,427 B2 | 12/2006 | Aruga et al. | |
| 2013/0062607 A1* | 3/2013 | Yamazaki | H01L 27/0266 |
| | | | 257/E29.273 |
| 2015/0008432 A1 | 1/2015 | Kim et al. | |
| 2016/0172428 A1 | 6/2016 | Song et al. | |
| 2016/0216548 A1* | 7/2016 | Fujikawa | H10K 59/179 |
| 2017/0287394 A1 | 10/2017 | Kim et al. | |
| 2019/0198598 A1 | 6/2019 | Lee et al. | |

FOREIGN PATENT DOCUMENTS

| | | |
|---|---|---|
| CN | 107272284 A | 10/2017 |
| CN | 109961752 A | 7/2019 |
| CN | 110190103 A | 8/2019 |

* cited by examiner

ANTI-CORROSION CIRCUIT, ELECTROSTATIC DISCHARGE PROTECTION CIRCUIT, ARRAY SUBSTRATE AND ELECTRONIC DEVICE

CROSS-REFERENCE TO RELATED PATENT APPLICATIONS

This application is a U.S. National Stage Application under 35 U.S.C. § 371 of International Patent Application No. PCT/CN2020/086443 filed Apr. 23, 2020, which is incorporated by reference in its entirety.

TECHNICAL FIELD

Embodiments of the present disclosure relates to an anti-corrosion circuit, an array substrate and an electronic device.

BACKGROUND

Organic light-emitting diodes (OLEDs) are all-solid-state devices that directly convert electrical energy into light energy, and have attracted great attention due to their advantages, such as thinness and lightness, high contrast, fast response, wide viewing angle, wide working temperature range, and so on. Active light-emitting devices similar to OLED further include quantum-dot light-emitting diodes and the like.

SUMMARY

At least one embodiment of the disclosure provides an array substrate. The array substrate comprises: a base substrate, comprising a display area and a peripheral area provided on at least one side of the display area; a plurality of sub-pixels, provided in the display area; a plurality of source signal lines, provided in the display area and electrically connected to the plurality of sub-pixels respectively, and the plurality of source signal lines being configured to provide data signal to the plurality of sub-pixels, wherein the plurality of source signal lines extend along a first direction and arranged sequentially along a second direction different from the first direction; a first power bus line, provided in the peripheral area and comprising a main body portion extending along the second direction; a plurality of sub-power lines, provided in the display area and electrically connected to the plurality of sub-pixels respectively, and the plurality of sub-power lines being configured to provide first power signal to the plurality of sub-pixels, wherein the first power bus line is connected to the plurality of sub-power lines; an electrostatic discharge protection circuit, provided on a side of the main body portion of the first power bus line away from the display area and electrically connected to the plurality of source signal lines, and comprising a plurality of first sub-signal lines and a plurality of second sub-signal lines, wherein the plurality of first sub-signal lines and the plurality of second sub-signal lines extend along the second direction and are alternately arranged along the first direction, and the main body portion of the first power bus line is adjacent to one first sub-signal line, and electrical property of the first power bus line is the same as electrical property of the one first sub-signal line.

For example, the electrostatic discharge protection circuit further comprises a first bus signal line and a second bus signal line, the plurality of first sub-signal lines are electrically connected to the first bus signal line, and the plurality of second sub-signal lines are electrically connected to the second bus signal line.

For example, the electrostatic discharge protection circuit comprises a plurality of switch groups, each switch group comprises a first switch and a second switch sharing a same electrode, the first switch and the second switch are electrically connected to a same source signal line through the same shared electrode, and different switch groups are electrically connected to different source signal lines.

For example, the main body portion of the first power bus line is a first signal line, and the one first sub-signal line adjacent to the main body portion is a second signal line, and the second sub-signal line adjacent to the second signal line is a third signal line; the first switch comprises a first input terminal and a first output terminal, the first input terminal is electrically connected to the same source signal line, and the first output terminal is electrically connected to the second signal line; the second switch comprises a second input terminal and a second output terminal, the second input terminal is electrically connected to the third signal line, and the second output terminal is electrically connected to the same source signal line.

For example, the first switch is a first transistor, the first transistor comprises a first gate electrode, a first electrode, and a second electrode, the first electrode serves as the first input terminal, and the second electrode is electrically connected to the first gate electrode and serves as the first output terminal; the second switch is a second transistor, the second transistor comprises a second gate electrode, a third electrode, and a fourth electrode, the third electrode serves as the second input terminal, and the fourth electrode is electrically connected to the second gate electrode and serves as the second output terminal.

For example, an absolute value of a voltage difference between the first signal line and the second signal line is smaller than an absolute value of a voltage difference between the first signal line and the third signal line.

For example, both the first signal line and the second signal line have positive electrical property, and the third signal line has negative electrical property.

For example, both the first signal line and the second signal line have negative electrical property, and the third signal line has positive electrical property.

For example, a voltage of the first signal line, a voltage of the second signal line, and a voltage of the third signal line are all constant voltages.

For example, the first signal line, the second signal line and the third signal line are provided side by side on a same surface.

For example, the plurality of source signal lines comprise signal line groups arranged sequentially along the second direction, and each of the signal line groups comprises a first source signal line, a second source signal line, a third source signal line, and a fourth source signal line arranged sequentially in the second direction; the plurality of switch groups of the electrostatic discharge protection circuit comprise a first switch group, a second switch group, a third switch group, and a fourth switch group that are arranged sequentially along the first direction, the first switch group is electrically connected to the first source signal line, the second switch group is electrically connected to the second source signal line, the third switch group is electrically connected to the third source signal line, and the fourth switch group is electrically connected to the fourth source signal line.

For example, the array substrate comprises a first gate metal layer, a second gate metal layer, and a source-drain metal layer provided sequentially on the base substrate, the first gate metal layer comprises a part of the plurality of source signal lines, the second gate metal layer comprises the other part of the plurality of source signal lines, the source-drain metal layer comprises the main body portion of the first power bus line, the plurality of sub-power lines, the plurality of first sub-signal lines, and the plurality of second sub-signal lines.

For example, at least one of the plurality of sub-pixels comprises a plurality of pixel switches; each pixel switch comprises a gate electrode, a first electrode and a second electrode; the gate electrode is provided in the first gate metal layer or the second gate metal layer, and the first electrode and the second electrode are provided in the source-drain metal layer.

For example, at least one of the main body portion of the first power bus line and the one first sub-signal line comprises aluminum metal.

For example, at least one of the main body portion of the first power bus line and the one first sub-signal line is a multilayer structure, the multilayer structure comprises a first metal layer, a second metal layer, and a third metal layer stacked sequentially, and a metal activity of the second metal layer is greater than metal activities of the first metal layer and the third metal layer.

For example, a voltage of the main body portion of the first power bus line and a voltage of the one first sub-signal line are both constant voltages.

For example, a size of a gap between the main body portion of the first power bus line and the one first sub-signal line is less than or equal to 300 microns in the first direction.

For example, the array substrate further comprises a second power bus line, wherein the second power bus line is provided in the peripheral area and is configured to provide second power signal to the plurality of sub-pixels.

At least one embodiment of the disclosure provide an anti-corrosion circuit, comprising a first signal line, a second signal line, and a third signal line arranged sequentially along a first direction. The first signal line, the second signal line, and the third signal line all extend in a second direction, and the second direction is different from the first direction; both the first signal line and the third signal line are adjacent to the second signal line; and the second signal line and the first signal line have the same electrical property, and the second signal line and the third signal line have different electrical properties.

For example, an absolute value of a voltage difference between the first signal line and the second signal line is smaller than an absolute value of a voltage difference between the first signal line and the third signal line.

For example, both the first signal line and the second signal line have positive electrical property, and the third signal line has negative electrical property.

For example, both the first signal line and the second signal line have negative electrical property, and the third signal line has positive electrical property.

For example, a voltage of the first signal line, a voltage of the second signal line, and a voltage of the third signal line are all constant voltages.

For example, the first signal line, the second signal line and the third signal line are provided side by side on a same surface.

For example, at least one of the first signal line and the second signal line comprises aluminum metal.

For example, at least one of the first signal line and the second signal line is a multilayer structure, the multilayer structure comprises a first metal layer, a second metal layer, and a third metal layer stacked sequentially, and a metal activity of the second metal layer is greater than metal activities of the first metal layer and the third metal layer.

For example, the anti-corrosion circuit comprises a first sub-circuit and a second sub-circuit spaced apart from each other. One of the first signal line and the second signal line belongs to the first sub-circuit, and the other of the first signal line and the second signal line belongs to the second sub-circuit.

For example, the second sub-circuit is an electrostatic discharge protection circuit, and the electrostatic discharge protection circuit comprises the third signal line and the other of the first signal line and the second signal line.

For example, the electrostatic discharge protection circuit comprises a first bus signal line and a second bus signal line arranged sequentially; the electrostatic discharge protection circuit further comprises a plurality of first sub-signal lines and a plurality of second sub-signal lines arranged sequentially, the plurality of first sub-signal lines are electrically connected to the first bus signal line, and the plurality of second sub-signal lines are electrically connected to the second bus signal line; and the other of the first signal line and the second signal line belongs to the first bus signal line, the second bus signal line, the plurality of first sub-signal lines, or the plurality of second sub-signal lines.

For example, the anti-corrosion circuit comprises a protected signal line, the protected signal line is electrically connected to the electrostatic discharge protection circuit; the electrostatic discharge protection circuit comprises a first switch and a second switch; the first switch comprises a first input terminal and a first output terminal, the first input terminal is electrically connected to the protected signal line, and the first output terminal is electrically connected to the other of the first signal line and the second signal line; the second switch comprises a second input terminal and a second output terminal, the second input terminal is electrically connected to the third signal line, and the second output terminal is electrically connected to the protected signal line.

For example, the first switch is a first transistor, the first transistor comprises a first gate electrode, a first electrode, and a second electrode, the first electrode serves as the first input terminal, and the second electrode is electrically connected to the first gate electrode and serves as the first output terminal; the second switch is a second transistor, the second transistor comprises a second gate electrode, a third electrode, and a fourth electrode, the third electrode serves as the second input terminal, and the fourth electrode is electrically connected to the second gate electrode and serves as the second output terminal.

For example, the electrostatic discharge protection circuit comprises the second signal line and the third signal line, and the second signal line is one of the plurality of first sub-signal lines, and the third signal line is one of the plurality of second sub-signal lines.

For example, a size of a gap between the first signal line and the second signal line is less than or equal to 300 microns in the first direction.

For example, the electrostatic discharge protection circuit comprises the first signal line and the third signal line, and the first signal line is the first bus signal line, and the third signal line is the second bus signal line.

For example, a size of a gap between the first signal line and the second signal line is less than or equal to 60 microns in the first direction.

At least one embodiment of the disclosure provides an electronic device, comprising the array substrate as described above or the anti-corrosion circuit as described above.

For example, the electronic device comprises: a pixel substrate, comprising a plurality of sub-pixels; a circuit board, connected to a side of the pixel substrate. In the case that the electronic device comprises the anti-corrosion circuit, the circuit board is configured to provide signals to the first signal line, the second signal line, and the third signal line; the second signal line and the third signal line of the anti-corrosion circuit are provided between the circuit board and the pixel substrate, and the first signal line of the anti-corrosion circuit is provided on a side of the second signal line facing towards the pixel substrate.

For example, the electronic device comprises: a pixel substrate, comprising a plurality of sub-pixels; a circuit board, connected to a side of the pixel substrate; and a detection circuit, provided on a side of the circuit board away from the pixel substrate. The detection circuit is the anti-corrosion circuit, the first signal line and the third signal line of the anti-corrosion circuit are provided on a side of the circuit board away from the pixel substrate, and the second signal line is configured to provide reset signal to the plurality of sub-pixels.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
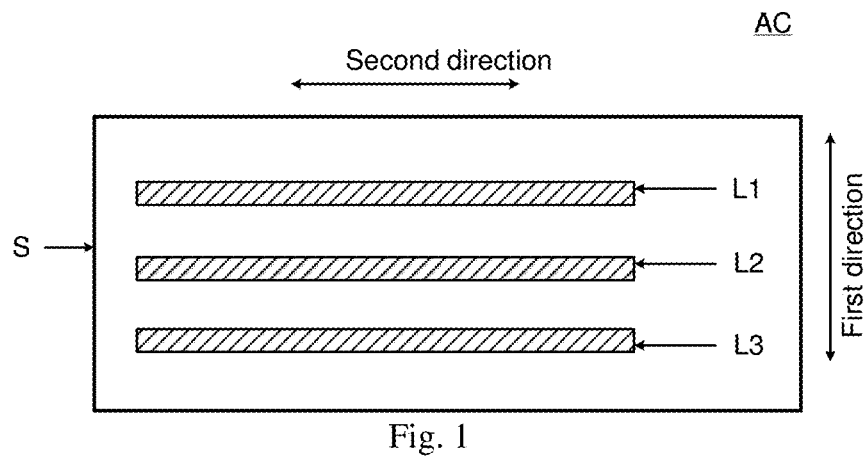
FIG. 1 is a simplified schematic diagram of a position relationship between a first signal line, a second signal line and a third signal line in an anti-corrosion circuit provided by embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "connect" or "interconnect" and the like are not limited to physical or mechanical connections, but may include electrical connections, whether direct or indirect. Expressions such as "up", "down", "left", "right" and the like are only used for expressing relative positional relationship, the relative positional relationship may be correspondingly changed in the case that the absolute position of a described object is changed.

In the display industry, with the continuous development of technology, the market of OLED display products, especially flexible OLED display products, is becoming larger and larger. In order to occupy a certain proportion in the future market competition, manufacturers pay more and more attention to the improvement of the yield of OLED display products; moreover, manufacturers are increasingly pursuing a smaller lower frame (that is, "narrow chin") to achieve display products with a larger scree-to-body ratio. Under this background, the different functional modules of the current OLED display circuit are set closer than before, and the space between the wirings is greatly reduced. However, the current OLED display products are prone to have localized short circuit or open circuit phenomenon.

In the research, the inventors of the present disclosure found that one of the reasons for the localized short circuit or open circuit of the current OLED display product is that there is a large electric field between some adjacent lines in the circuit, so that electrochemical corrosion of these adjacent lines is prone to occur under the condition of high temperature and high humidity.

In view of the above discovery, the inventors of the present disclosure provide an anti-corrosion circuit and a manufacturing method thereof, an array substrate, and an electronic device including the anti-corrosion circuit or the array substrate.

FIG. 1 is a simplified schematic diagram of a position relationship between a first signal line, a second signal line and a third signal line in an anti-corrosion circuit provided by the embodiments of the present disclosure. For example, the first signal line, the second signal line and the third signal line belong to an electrostatic discharge protection circuit, please refer to the embodiments shown in FIGS. 7 and 13; or the first signal line, the second signal line and the third signal line belong to a detection circuit, please refer to the embodiments shown in FIG. 10A. As shown in FIGS. 1, 7, 10A and 13, the embodiments of the present disclosure provide an anti-corrosion circuit AC comprising a first signal line L1, a second signal line L2 and a third signal line L3 located on the same side of a surface S. The first signal line L1, the second signal line L2 and the third signal line L3 are arranged sequentially in a first direction and extend substantially in a second direction ("substantially" means ignoring the influence of errors caused by the manufacturing process). The second direction is different from the first direction. Both the first signal line L1 and the third signal line L3 are adjacent to the second signal line L2, that is, the nearest signal line adjacent to one side of the second signal line L2 is the first signal line L1 and the nearest signal line adjacent to the other side of the second signal line L2 is the third signal line L3 (that is, no other signal line is arranged between the second signal line L2 and each of the first signal line L1 and the third signal line L3). The second signal line L2 and the first signal line L1 have the same electrical property, and the second signal line L2 and the third signal line L3 have different electrical properties.

It should be noted that the same electrical property means that both are positive electrical property, or negative electrical property, or both are zero; different electrical properties means that one of the signal lines is positive electrical property and the other is negative electrical property or zero, or one of the signal lines is negative electrical property and the other is positive electrical property or zero.

For the first signal line L1, the second signal line L2 and the third signal line L3 respectively applied with a given voltage and arranged sequentially, if the first signal line L1 is adjacent to the third signal line L3, the electrochemical corrosion is easy to occur between the first signal line L1 and the third signal line L3 due to the different electrical properties of the first signal line L1 and the third signal line L3. In the embodiments of the present disclosure, the first signal line L1 is adjacent to the second signal line L2. On this basis, in the case that the first signal line L1 and the second signal line L2 have the same electrical property which is different from the electrical property of the third signal line L3, the embodiments of the present disclosure are, as compared with the case that the first signal line L1 is adjacent to the third signal line L3, beneficial to avoid electrochemical corrosion between the first signal line L1 and the second signal line L2 (especially under the condition of high temperature and high humidity). That is, it is beneficial to avoid the corrosion of the first signal line L1 and the second signal line L2. In some embodiments, because electrochemical corrosion is not easy to occur between the first signal line L1 and the second signal line L2, the distance between the first signal line L1 and the second signal line L2 can be designed to be smaller, thereby narrowing the frame of the display panel (such as the lower frame) and increasing the screen-to-body ratio. In this way, some embodiments of the present disclosure alleviate the localized short circuit or open circuit while realizing the narrow frame design.

For example, in order to further avoid electrochemical corrosion between the first signal line L1 and the second signal line L2, on the basis that the second signal line L2 and the first signal line L1 have the same electrical property and the second signal line L2 and the third signal line L3 have different electrical properties, the absolute value of the voltage difference between the first signal line L1 and the second signal line L2 is less than the absolute value of the voltage difference between the first signal line L1 and the third signal line L3.

It should be noted that FIGS. 1, 7, 10A and 13 is illustrated by taking the second direction being perpendicular to the first direction as an example. In other embodiments, the first direction and the second direction may not be perpendicular to each other. In addition, in the embodiments of the present disclosure, one signal line adjacent to another signal line means that the one signal line extends in the same direction as the another signal line, and no other signal line extending in the same direction is arranged between the one signal line and the another signal line.

For example, in some embodiments of the present disclosure, according to the design that the first signal line L1 and the second signal line L2 have the same electrical property which is different from that of the third signal line L3, it can be concluded that the voltage of the second signal line L2 is different from that of the third signal line L3, and both the voltage of the first signal line L1 and the voltage of the second signal line L2 are greater than or smaller than the voltage of the third signal line L3 (it should be noted that the positive voltage is greater than the negative voltage). For example, the voltage of the first signal line L1 is greater than that of the second signal line L2, and the voltage of the second signal line L2 is greater than that of the third signal line L3; or, the voltage of the first signal line L1 is smaller than the voltage of the second signal line L2, and the voltage of the second signal line L2 is smaller than the voltage of the third signal line L3. The voltage relationship between the first signal line L1, the second signal line L2, and the third signal line L3 includes, but is not limited to, these listed embodiments.

For example, in the case that the second signal line L2 and the first signal line L1 have the same electrical property and the second signal line L2 and the third signal line L3 have different electrical properties, both the first signal line L1 and the second signal line L2 has positive electrical property, and the third signal line L3 has negative electrical property. For example, the voltage of the first signal line L1 and the voltage of the second signal line L2 are both positive, and the voltage of the third signal line L3 is negative; or, the voltage of the first signal line L1 and the voltage of the second signal line L2 are both negative, and the voltage of the third signal line L3 is positive.

For example, the voltage of the first signal line L1 is positive, the voltage of the second signal line L2 is positive, and the voltage of the third signal line L3 is negative; or, the voltage of the first signal line L1 is negative, the voltage of the second signal line L2 is negative, and the voltage of the third signal line L3 is positive.

For example, the voltage of the first signal line L1, the voltage of the second signal line L2 and the voltage of the third signal line L3 are all constant voltages. The inventors of the present disclosure found that electrochemical corrosion is prone to occur in the case that constant voltages are applied to the adjacent signal lines. Compared with the arrangement mode in which the first signal line L1 is adjacent to the third signal line L3, even though the voltage of the first signal line L1, the voltage of the second signal line L2 and the voltage of the third signal line L3 are all constant voltages, the electrochemical corrosion is not easy to occur between the first signal line L1 and the second signal line L2 because the first signal line L1 and the second signal line L2 have the same electrical property.

For example, the first signal line L1, the second signal line L2 and the third signal line L3 are provided side by side on the same surface S, that is, the first signal line L1, the second signal line L2 and the third signal line L3 are in direct contact with the same surface S which is configured for carrying them. The inventors of the present disclosure found that the electrochemical corrosion is likely to occur in the case that two adjacent signal lines are provided side by side on the same surface. Compared with the arrangement mode in which the first signal line L1, the third signal line L3 and the second signal line L2 are sequentially provided side by side on the same surface, the positions of the second signal line L2 and the third signal line L3 are exchanged in the embodiments of the present disclosure, and after the exchange, the first signal line L1 and the second signal line L2 adjacent to each other have the same electrical properties. In this way, even though the first signal line L1, the second signal line L2 and the third signal line L3 are provided side by side on the same surface S, the electrochemical corrosion is not easy to occur between the first signal line L1 and the second signal line L2 adjacent to each other after the exchange.

For example, the first signal line L1, the second signal line L2 and the third signal line L3 are formed in such a way: forming a conductive layer on the surface S, and then patterning the conductive layer to form the first signal line L1, the second signal line L2 and the third signal line L3 side by side on the surface S.

For example, at least one of the first signal line L1 and the second signal line L2 includes an aluminum metal layer. For example, the conductive layer for forming the first signal line L1, the second signal line L2 and the third signal line L3 has the aluminum metal layer; in this situation, the first signal line L1, the second signal line L2 and the third signal line L3 all include the aluminum metal layer. The inventors of the present disclosure found that the aluminum metal is prone to occur the electrochemical corrosion due to high metal activity. In the embodiments of the present disclosure, even though at least one of the first signal line L1 and the second signal line L2 includes the aluminum metal layer, the electrochemical corrosion is not easy to occur between the first signal line L1 and the second signal line L2, because the first signal line L1 and the second signal line L2 have the same electrical property.

Figure 2:
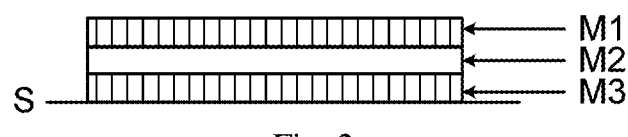
FIG. 2 is a schematic diagram of a multilayer structure of a signal line in the anti-corrosion circuit provided by the embodiments of the present disclosure.

FIG. 2 is a schematic diagram of a multilayer structure of a signal line in the anti-corrosion circuit provided by the embodiments of the present disclosure. For example, as shown in FIG. 2, at least one of the first signal line L1 and the second signal line L2 is of a multilayer structure. The multilayer structure includes a first metal layer M1, a second metal layer M2 and a third metal layer M3 stacked sequentially in a direction perpendicular to the surface S, and the metal activity of the second metal layer M2 is greater than that of the first metal layer M1 and that of the third metal layer M3. For example, the conductive layer used to form the first signal line L1, the second signal line L2 and the third signal line L3 has the multilayer structure, in this situation, the first signal line L1, the second signal line L2 and the third signal line L3 all have the multilayer film structure. For example, the first metal layer M1 is a titanium metal layer, the second metal layer M2 is an aluminum metal layer, and the third metal layer M3 is a titanium metal layer. The first signal line L1, the second signal line L2 and the third signal line L3 which are fabricated as the multilayer structure are beneficial to have better electrical performance.

Figure 3:
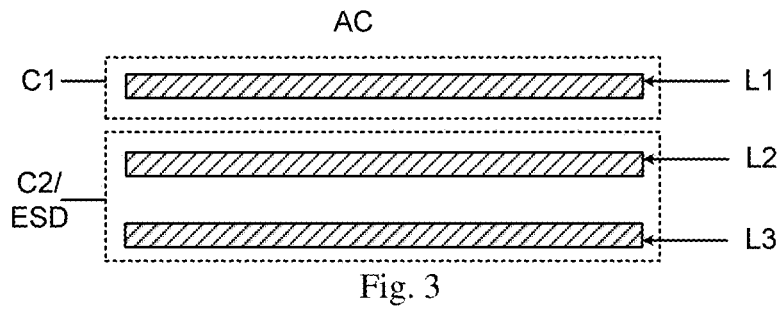
FIG. 3 is a schematic diagram of the anti-corrosion circuit including a first sub-circuit and a second sub-circuit provided by the embodiments of the present disclosure.

FIG. 3 is a schematic diagram of the anti-corrosion circuit including a first sub-circuit and a second sub-circuit provided by the embodiments of the present disclosure. For example, as shown in FIG. 3, the anti-corrosion circuit AC provided by at least one embodiment of the present disclosure includes a first sub-circuit C1 and a second sub-circuit C2 separated from each other, one of the first signal line L1 and the second signal line L2 belongs to the first sub-circuit C1, and the other of the first signal line L1 and the second signal line L2 belongs to the second sub-circuit C2. For example, as shown in FIG. 3, the first signal line L1 belongs to the first sub-circuit C1 and the second signal line L2 belongs to the second sub-circuit C2. In the embodiments of the present disclosure, because one of the first signal line L1 and the second signal line L2 belongs to the first sub-circuit C1 and the other of the first signal line L1 and the second signal line L2 belongs to the second sub-circuit C2, and because the electrochemical corrosion is not easy to occur between the first signal line L1 and the second signal line L2, the first sub-circuit C1 and the second sub-circuit C2 can be arranged more closely, which is beneficial for achieving narrow frame design.

For example, as shown in FIG. 3, the second sub-circuit C2 is an electrostatic discharge protection circuit ESD for releasing static electricity, and the electrostatic discharge protection circuit ESD includes the other of the first signal line L1 and the second signal line L2 and the third signal line L3. FIG. 3 takes the electrostatic discharge protection circuit ESD including the second signal line L2 and the third signal line L3 as an example. In other embodiments, the electrostatic discharge protection circuit ESD includes the first signal line L1 and the third signal line L3. In other embodiments, the second sub-circuit C2 is not the electrostatic discharge protection circuit.

Figure 4A:
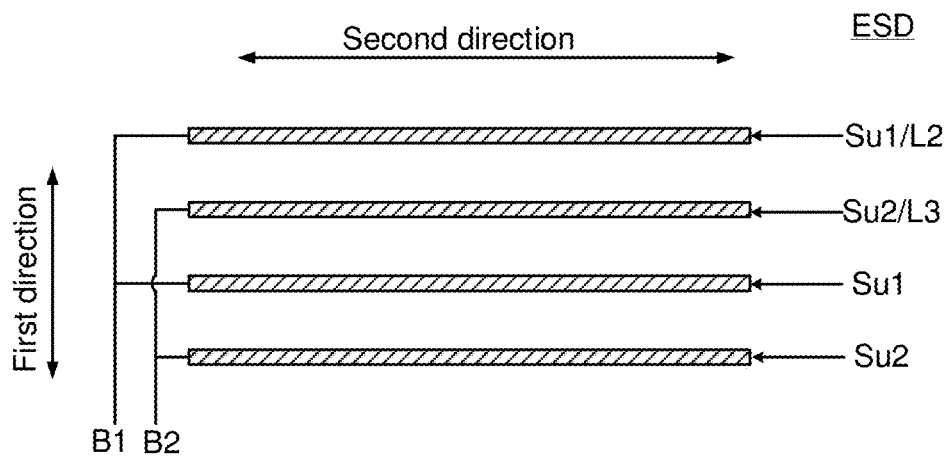
FIGS. 4A and 4B are simplified schematic diagrams of bus signal lines and sub-signal lines included in an electrostatic discharge protection circuit in the anti-corrosion circuit provided by the embodiments of the present disclosure.
Figure 4B:
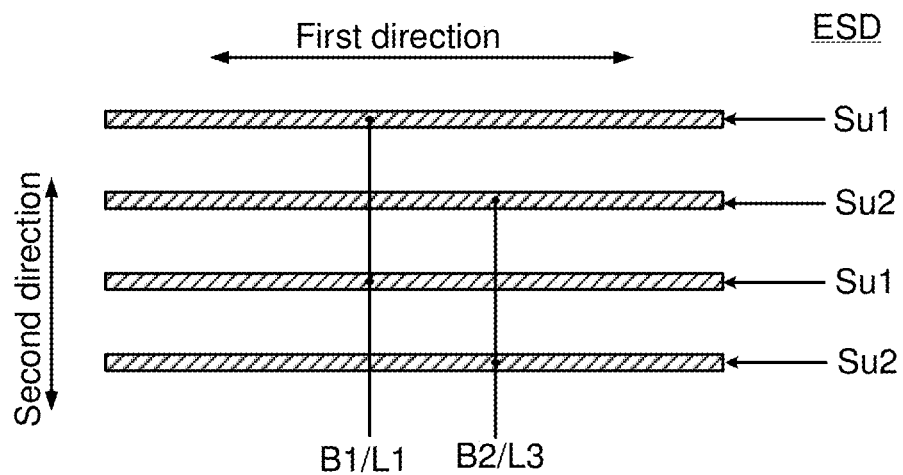
Figure 7:
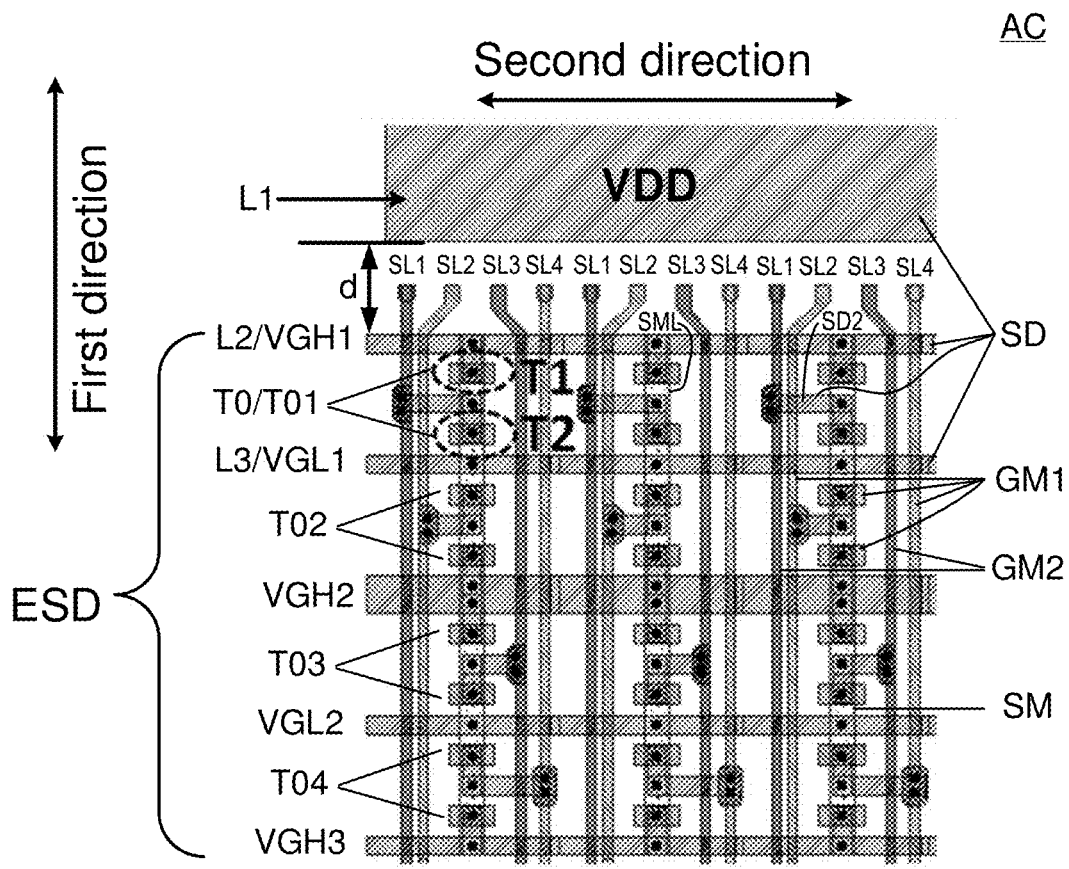
FIG. 7 is a top view schematic diagram of the anti-corrosion circuit provided by the embodiments of the present disclosure.

FIGS. 4A and 4B are simplified schematic diagrams of bus signal lines and sub-signal lines included in the electrostatic discharge protection circuit in the anti-corrosion circuit provided by the embodiments of the present disclosure. The arrangement mode of the sub-signal lines in the embodiment shown in FIG. 4A may refer to the embodiment shown in FIG. 7; the bus signal lines and sub-signal lines in the embodiment shown in FIG. 4A may refer to the embodiment shown in FIG. 13 when applied to the array substrate; and the embodiment shown in FIG. 4B may refer to the embodiments shown in FIGS. 10A and 10B when applied to the detection circuit. For example, as shown in FIGS. 4A and 4B, the electrostatic discharge protection circuit ESD includes a plurality of first sub-signal lines Su1 (for example, please refer to the VGH in FIG. 7, FIG. 13 and FIGS. 10A to 10B, FIG. 13 only schematically illustrates two VGHs but does not reflect the real size) and a plurality of second sub-signal lines Su2 (for example, please refer to the VGL in FIG. 7, FIG. 13 and FIGS. 10A-10B, FIG. 13 only schematically illustrates two VGHs but does not reflect the real size). The plurality of first sub-signal lines Su1 and the plurality of second sub-signal lines Su2 are arranged alternately, for example, one second sub-signal line Su2 is arranged between two adjacent first sub-signal lines Su1, and one first sub-signal line Su1 is arranged between two adjacent second sub-signal lines Su2. For example, as shown in FIG. 4A, FIG. 7 and FIG. 13, the first sub-signal lines Su1 and the second sub-signal lines Su2 are arranged sequentially in the first direction and all extend in the second direction; or, as shown in FIG. 4B and FIGS. 10A-10B, the first sub-signal lines Su1 and the second sub-signal lines Su2 are arranged sequentially in the second direction and all extend in the first direction.

Figure 10A:
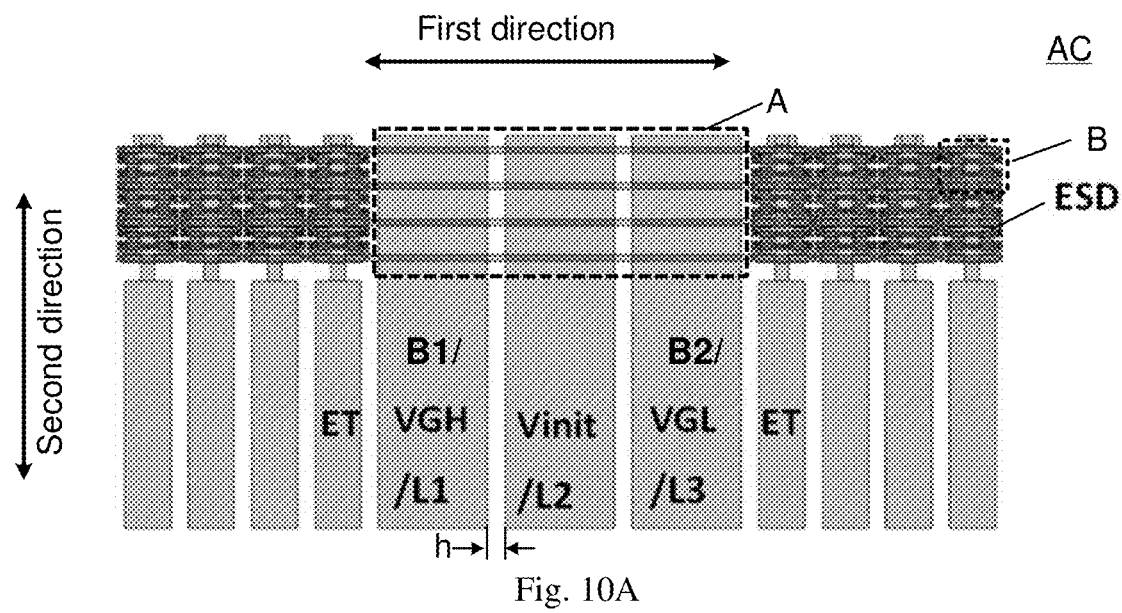
FIG. 10A is another top view schematic diagram of the anti-corrosion circuit provided by the embodiments of the present disclosure.
Figure 10B:
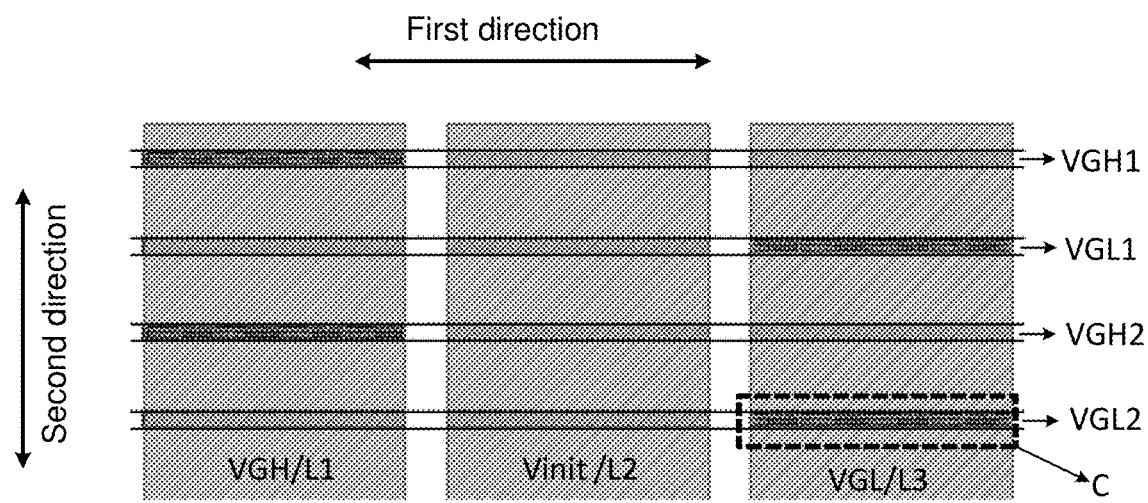
FIG. 10B is a partially enlarged schematic diagram of an area A in FIG. 10A.
Figure 13:
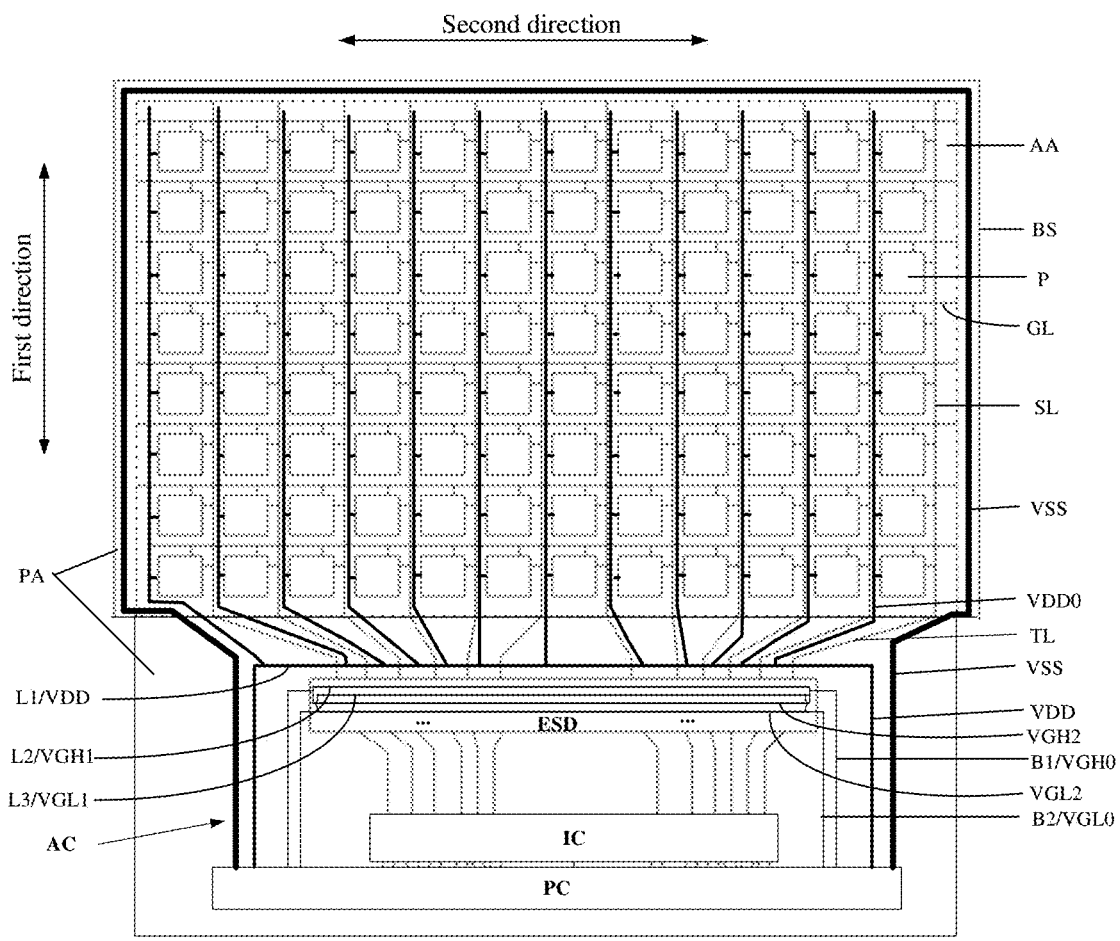
FIG. 13 is a top view schematic diagram of an array substrate provided by the embodiments of the present disclosure.

For example, as shown in FIGS. 4A-4B, FIG. 13 and FIGS. 10A-10B, the electrostatic discharge protection circuit ESD includes a first bus signal line B1 and a second bus signal line B2 arranged sequentially, for example, the arrangement direction of the sub-signal lines is different from that of the above-mentioned bus signal lines. The plurality of first sub-signal lines Su1 are electrically connected to the first bus signal line B1; for example, an end of the first sub-signal line Su1 is electrically connected to the first bus signal line B1 (as shown in FIGS. 4A and 13), or a part between two ends of the first sub-signal line Su1 is electrically connected to the first bus signal line B1 (as shown in FIG. 4B and FIGS. 10A-10B, the black dots in FIG. 4B indicate the electrical connection). The plurality of second sub-signal lines Su2 are electrically connected with the second bus signal line B2; for example, an end of the second sub-signal line Su2 is electrically connected with the second bus signal line B2 (as shown in FIGS. 4A and B); or a part between two ends of the second sub-signal line Su2 is electrically connected with the second bus signal line B2 (as shown in FIG. 4B and FIGS. 10A-10B). The other of the first signal line L1 and the second signal line L2 included in the second sub-circuit C2 (shown in FIG. 3) belongs to the first bus signal line B1, the second bus signal line B2, the plurality of first sub-signal lines Su1 or the plurality of second sub-signal lines Su2.

For example, the first bus signal line B1 is configured to apply a first constant voltage to the plurality of first sub-signal lines Su1, and the second bus signal line B2 is configured to apply a second constant voltage different from the first constant voltage to the plurality of second sub-signal lines Su2. For example, the first constant voltage is greater than the second constant voltage. That is, the first bus signal line B1, the first sub-signal line Su1, the second bus signal line B2 and the second sub-signal line Su2 are all operated with the applied constant voltage, and the constant voltage of the first bus signal line B1 is greater than the constant voltage of the second bus signal line B2, so that the constant voltage of the first sub-signal line Su1 is greater than the constant voltage of the second sub-signal line Su2.

For example, as shown in FIGS. 4A and 13, the electrostatic discharge protection circuit ESD includes the second signal line L2 and the third signal line L3, the second signal line L2 is one of the plurality of first sub-signal lines Su1, and the third signal line L3 is one of the plurality of second sub-signal lines Su2. For example, in FIG. 4A, the outermost first sub-signal line Su1 is the second signal line L2, and the second sub-signal line Su2 adjacent to the outermost first sub-signal line Su1 is the third signal line L3. In this situation, the first signal line L1 (not shown in FIG. 4A) is located on a side of the first sub-signal line Su1/L2 away from the second sub-signal line Su2/L3.

For example, in the case that the outermost first sub-signal line Su1 is the second signal line L2 and the second sub-signal line Su2 adjacent to the outermost first sub-signal line Su1 is the third signal line L3, the gap between an orthographic projection of the first signal line L1 on the surface S and an orthographic projection of the second signal line L2 on the surface S has a size of less than or equal to 300 microns in the arrangement direction of the first signal line L1 and the second signal line L2 (that is, the first direction). For example, the size is less than or equal to 200 microns. For example, the size is less than or equal to 100 microns. Compared with the arrangement mode in which the first signal line L1 is adjacent to the third signal line L3, the distance between the first signal line L1 and the second signal line L2 adjacent to each other in the embodiments of the present disclosure is smaller, which is beneficial for the narrow frame design.

For example, as shown in FIGS. 4B and 10A, the electrostatic discharge protection circuit ESD includes the first signal line L1 and the third signal line L3, the first signal line L1 is the first bus signal line B1, and the third signal line L3 is the second bus signal line B2. In this situation, the second signal line L2 (not shown in FIG. 4B) is located between the first bus signal line B1/L1 and the second bus signal line B2/L3.

For example, in the case that the first signal line L1 is the first bus signal line B1 and the third signal line L3 is the second bus signal line B2, the gap between the orthographic projection of the first signal line L1 on the surface S and the orthographic projection of the second signal line L2 on the surface S has a size less than or equal to 60 microns in the arrangement direction of the first signal line L1 and the second signal line L2 (that is, the first direction). For example, the size is greater than or equal to 50 microns and less than or equal to 60 microns.

Figures 5A, 5B, 5C:
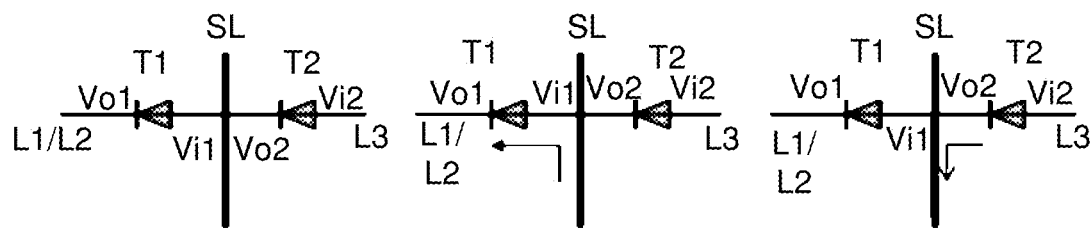
FIG. 5A is an equivalent circuit diagram of the electrostatic discharge protection circuit in the anti-corrosion circuit provided by the embodiment of the present disclosure.
FIG. 5B is a principle diagram of releasing positive charges by using the electrostatic discharge protection circuit shown in FIG. 5A.
FIG. 5C is a principle diagram of releasing negative charges by using the electrostatic discharge protection circuit shown in FIG. 5A.

FIG. 5A is an equivalent circuit diagram of the electrostatic discharge protection circuit in the anti-corrosion circuit provided by the embodiments of the present disclosure. FIG. 5B is a principle diagram of releasing positive charges by using the electrostatic discharge protection circuit shown in FIG. 5A. FIG. 5C is a principle diagram of releasing negative charges by using the electrostatic discharge protection circuit shown in FIG. 5A. For example, as shown in FIG. 5A, the anti-corrosion circuit includes a protected signal line SL and the electrostatic discharge protection circuit ESD (not marked in FIG. 5A) electrically connected to the protected signal line SL; the electrostatic discharge protection circuit ESD includes a switch group, and the switch group includes a first switch T1 and a second switch T2. The first switch T1 includes a first input terminal Vi1 and a first output terminal Vo1, the first input terminal Vi1 is electrically connected with the protected signal line SL, and the first output terminal Vo1 is electrically connected with the first signal line L1 or the second signal line L2; the second switch T2 includes a second input terminal Vi2 and a second output terminal Vo2, the second input terminal Vi2 is electrically connected with the third signal line L3, and the second output terminal Vo2 is electrically connected with the protected signal line SL. The static electricity on the protected signal line SL can be released through the first switch T1, the second switch T2, the first signal line L1/the second signal line L2, and the third signal line L3, in order to avoid accumulating more static electricity on the protected signal line SL.

For example, the work principle of the electrostatic discharge protection circuit ESD is as follows: in the case that the electrostatic charges on the protected signal line SL are positive charges and the static electricity on the protected signal line SL is too large, the first switch T1 is turned on, so that the positive charges are released through the first signal line L1 or the second signal line L2, as shown in FIG. 5B (the arrow in the figure indicates the current flow direction). In the case that the electrostatic charges on the protected signal line SL are negative charges and the static electricity on the protected signal line SL is too large, the second switch T2 is turned on, so that the negative charges are released through the third signal line L3, as shown in FIG. 5C (the arrow in the figure indicates the current flow direction).

Figure 6:
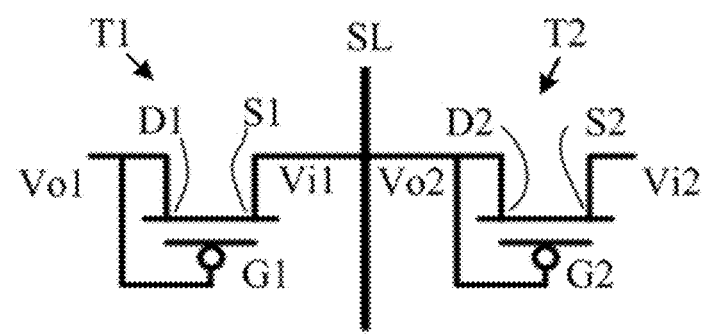
FIG. 6 is another equivalent circuit diagram of the electrostatic discharge protection circuit in the anti-corrosion circuit provided by the embodiments of the present disclosure.

FIG. 6 is another equivalent circuit diagram of the electrostatic discharge protection circuit in the anti-corrosion circuit provided by the embodiments of the present disclosure. For example, as shown in FIG. 6, the first switch T1 is a first transistor, the first transistor includes a first gate electrode G1, a first electrode S1 and a second electrode D1, the first electrode S1 serves as the first input terminal Vi1, and the second electrode D1 is electrically connected to the first gate electrode G1 and serves as the first output terminal Vo1. The second switch T2 is a second transistor, the second transistor includes a second gate electrode G2, a third electrode S2 and a fourth electrode D2, the third electrode S2 serves as the second input terminal Vi2, and the fourth electrode D2 is electrically connected to the second gate electrode G2 and serves as the second output terminal Vo2. For example, both the first transistor and the second transistor are P-type transistors.

Figure 8A:
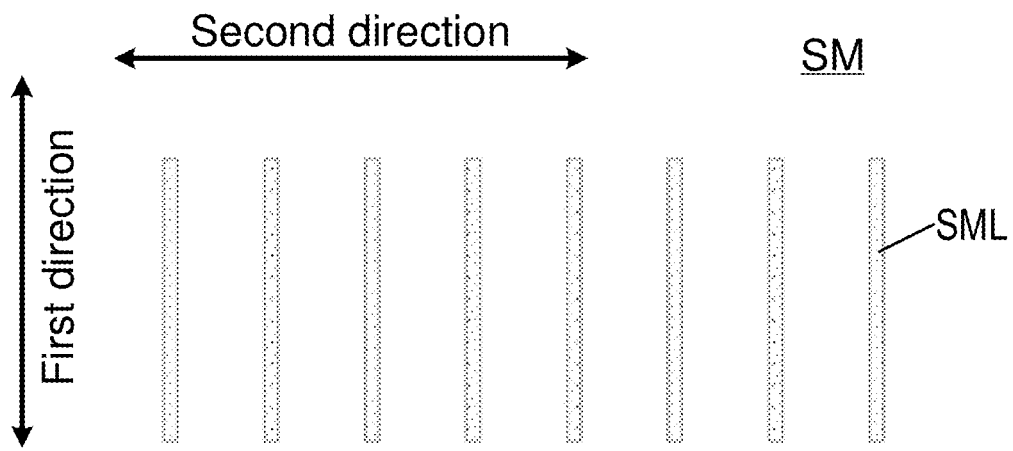
FIG. 8A is a top view schematic diagram of a semiconductor layer included in the anti-corrosion circuit shown in FIG. 7.
Figure 8B:
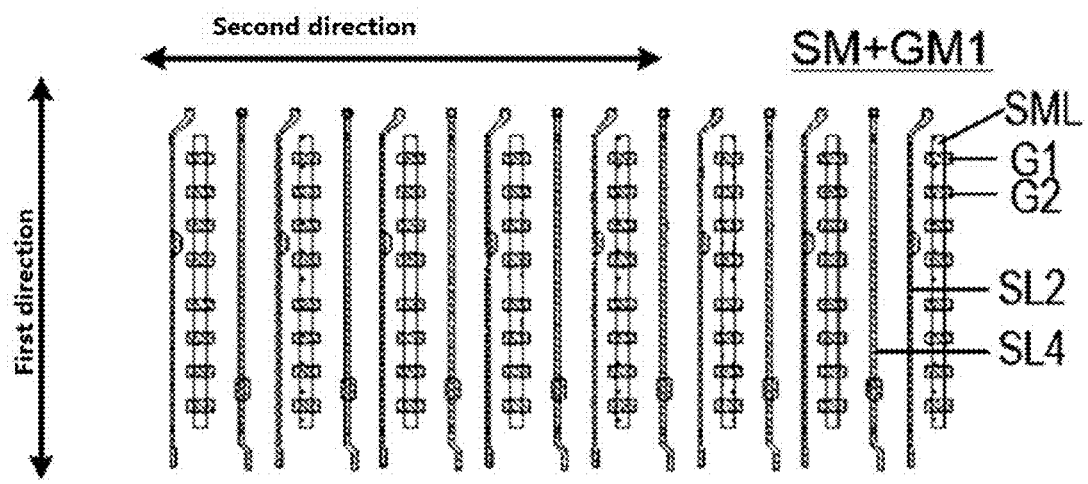
FIG. 8B is a top view schematic diagram of the semiconductor layer and a first gate metal layer included in the anti-corrosion circuit shown in FIG. 7.
Figure 8C:
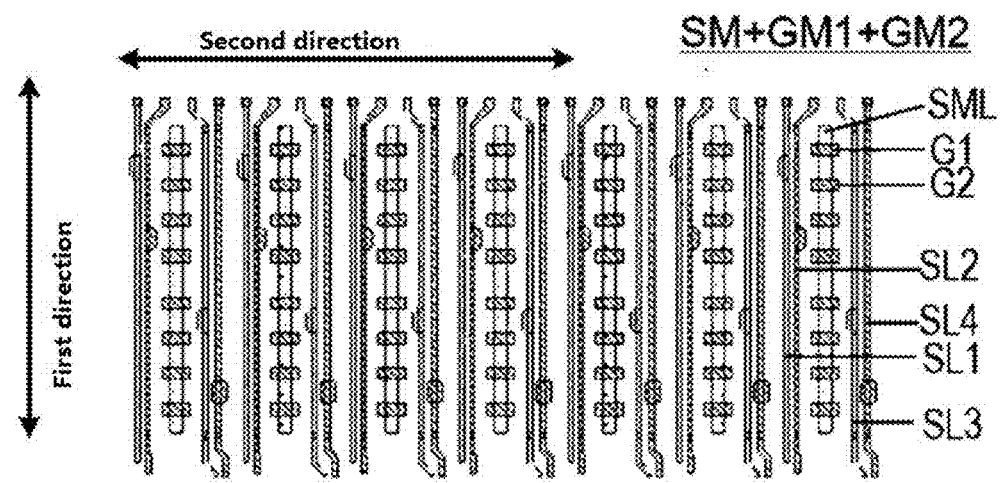
FIG. 8C is a top view schematic diagram of the semiconductor layer, the first gate metal layer and the second gate metal layer included in the anti-corrosion circuit shown in FIG. 7.

FIG. 7 is a top view schematic diagram of the anti-corrosion circuit provided by the embodiments of the present disclosure; FIG. 8A is a top view schematic diagram of a semiconductor layer included in the anti-corrosion circuit shown in FIG. 7; FIG. 8B is a top view schematic diagram of the semiconductor layer and a first gate metal layer included in the anti-corrosion circuit shown in FIG. 7; FIG. 8C is a top view schematic diagram of the semiconductor layer, the first gate metal layer and a second gate metal layer included in the anti-corrosion circuit shown in FIG. 7.

For example, as shown in FIG. 7, the electrostatic discharge protection circuit ESD includes a plurality of switch groups T0, each of the plurality of switch groups T0 includes a first switch T1 and a second switch T2 that share the same electrode (for details of the electrical connection relationship between T1 and T2, please refer to the relevant description above), and the first switch T1 and the second switch T2 are electrically connected to the same source signal line SL through the same shared electrode. Thus, the source signal line SL releases static electricity through the corresponding switch group T0 in connection with source signal line SL, and different switch groups T0 are electrically connected to different source signal lines SL.

For example, as shown in FIG. 7, the plurality of source signal lines SL in the anti-corrosion protection circuit AC include signal line groups arranged sequentially in a second direction, each of the signal line groups includes a first source signal line SL1, a second source signal line SL2, a third source signal line SL3 and a fourth source signal line SL4 arranged sequentially in the second direction. The electrostatic discharge protection circuit ESD includes a plurality of switch groups T0, which include the first switch group T01, the second switch group T02, the third switch group T03 and the fourth switch group T04 arranged sequentially along the first direction. The first switch group T01 is electrically connected to the first source signal line SL1 to release static electricity on the first source signal line SL1. The second switch group T02 is adjacent to the first switch group T01 and is electrically connected with the second source signal line SL2 to release static electricity on the second source signal line SL2. The third switch group T03 is adjacent to the second switch group T02 and is electrically connected with the third source signal line SL3 to release static electricity on the third source signal line SL3. The fourth switch group T04 is adjacent to the third switch group T03 and is electrically connected with the fourth source signal line SL4 to release static electricity on the fourth source signal line SL4. For example, the switch groups T01 to T04 included in the electrostatic discharge protection circuit ESD are periodically arranged; accordingly, the first source signal line SL1 to the fourth source signal line SL4 are also periodically arranged.

For example, as shown in FIG. 7, the anti-corrosion circuit AC provided by at least one embodiment of the present disclosure includes the semiconductor layer SM, the first gate metal layer GM1, the second gate metal layer GM2 and the source-drain metal layer SD. As shown in FIGS. 7 and 8A, the semiconductor layer SM includes a plurality of semiconductor lines SML spaced apart from each other, the plurality of semiconductor lines SML extend in the first direction and are arranged sequentially in the second direction. As shown in FIGS. 7 and 8B, the first gate metal layer GM1 includes a plurality of gate electrode groups, each of the plurality of gate electrode groups includes the first gate electrode G1 and the second gate electrode G2 arranged sequentially in the first direction, and the first gate electrode G1 and the second gate electrode G2 included in the same gate electrode group overlap with the same semiconductor line SML. The first gate metal layer GM1 further includes a portion of the plurality of source signal lines SL. For example, the first gate metal layer GM1 includes a plurality of second source signal lines SL2 and a plurality of fourth source signal lines SL4; the plurality of second source signal lines SL2 and the plurality of fourth source signal lines SL4 extend in the first direction and are arranged sequentially in the second direction. As shown in FIGS. 7 and 8C, the second gate metal layer GM2 includes the other portion of the plurality of source signal lines SL. For example, the second gate metal layer GM2 includes a plurality of first source signal lines SL1 and a plurality of third source signal lines SL3; the plurality of first source signal lines SL1 and the plurality of third source signal lines SL3 are arranged sequentially in the second direction and extend in the first direction. As shown in FIG. 7, the source-drain metal layer SD includes one first high voltage signal line VDD, a plurality of second high voltage signal lines VGH (please refer to VGH1-VGH3), and a plurality of low voltage signal lines VGL (please refer to VGL1-VGL2), all of which are arranged sequentially in the first direction and extend in the second direction; the second high voltage signal lines VGH and the plurality of low voltage signal lines VGL are arranged alternately, and the gate electrode group is arranged between the second high-voltage signal line VGH and the low voltage signal line VGL adjacent to each other. For example, the voltage of the first high voltage signal line VDD, the voltage of the second high voltage signal line VGH, and the voltage of the low voltage signal line VGL are all constant voltage, and the voltage of the first high voltage signal line VDD and the voltage of the second high voltage signal line VGH are greater than the voltage of the low voltage signal line VGL. For example, each second high voltage signal line VGH includes a main body extending in a second direction and branches protruding from the main body and extending to the low voltage signal line VGL; each branch overlaps and is electrically connected with one semiconductor line SML (the black dot in FIG. 7 indicates a via hole for electrical connection). The source-drain metal layer SD further includes a plurality of relay elements SD2 spaced apart from each other, each of the plurality of relay element SD2 is located between the second high voltage signal line VGH and the low voltage signal line VGL adjacent to each other. One end of the relay element SD2 is electrically connected with one source signal line (that is, one of the first source signal line SL1 and the fourth source signal line SL4); the other end of the relay element SD2 overlaps and is electrically connected with one semiconductor signal line SML, and the other end of the relay element SD2 overlaps and is electrically with one second gate electrode G2. For example, the planar shape of the relay element SD2 is L-shaped.

It should be noted that the "high voltage" related to the first high voltage signal line VDD and the second high voltage signal line VGH means that the voltages of these two signal lines are both higher than that of the low voltage signal line VGL; the "low voltage" related to the low voltage signal line VGL means that the voltage of the low voltage signal line VGL is lower than the voltages of the first high voltage signal line VDD and the second high voltage signal line VGH.

In the anti-corrosion circuit shown in FIG. 7, the first sub-circuit C1 includes the first high voltage signal line VDD, and the second sub-circuit C2 includes the second high voltage signal lines VGH1-VGH3, the low voltage signal lines VGL1-VGL2, the relay element SD2, the source signal lines SL1-SL4, the semiconductor line SML and the gate electrode groups. The first high voltage signal line VDD is an example of the aforementioned first signal line L1, the second high voltage signal line VGH1 is an example of the aforementioned second signal line L2, the low voltage signal line VGL1 is an example of the aforementioned third signal line L3, and the first source signal line SL1 electrically connected to the second signal line L2 and the third signal line L3 is an example of the aforementioned protected signal line SL. The plurality of second high voltage signal lines VGH are examples of the aforementioned plurality of first sub-signal lines, and the plurality of low voltage signal lines are examples of the aforementioned plurality of second sub-signal lines.

For example, as shown in FIG. 7, the size d of the gap between the first signal line L1 and the second signal line L2 in the first direction is less than or equal to 300 microns. For example, the size d is less than or equal to 200 microns. For example, the size d is less than or equal to 100 microns. In the embodiment of the present disclosure shown in FIG. 7, because the distance between the first signal line L1 and the second signal line L2 is relatively small, it is beneficial to realize the narrow frame design, especially the "narrow chin" design.

Figure 9A:
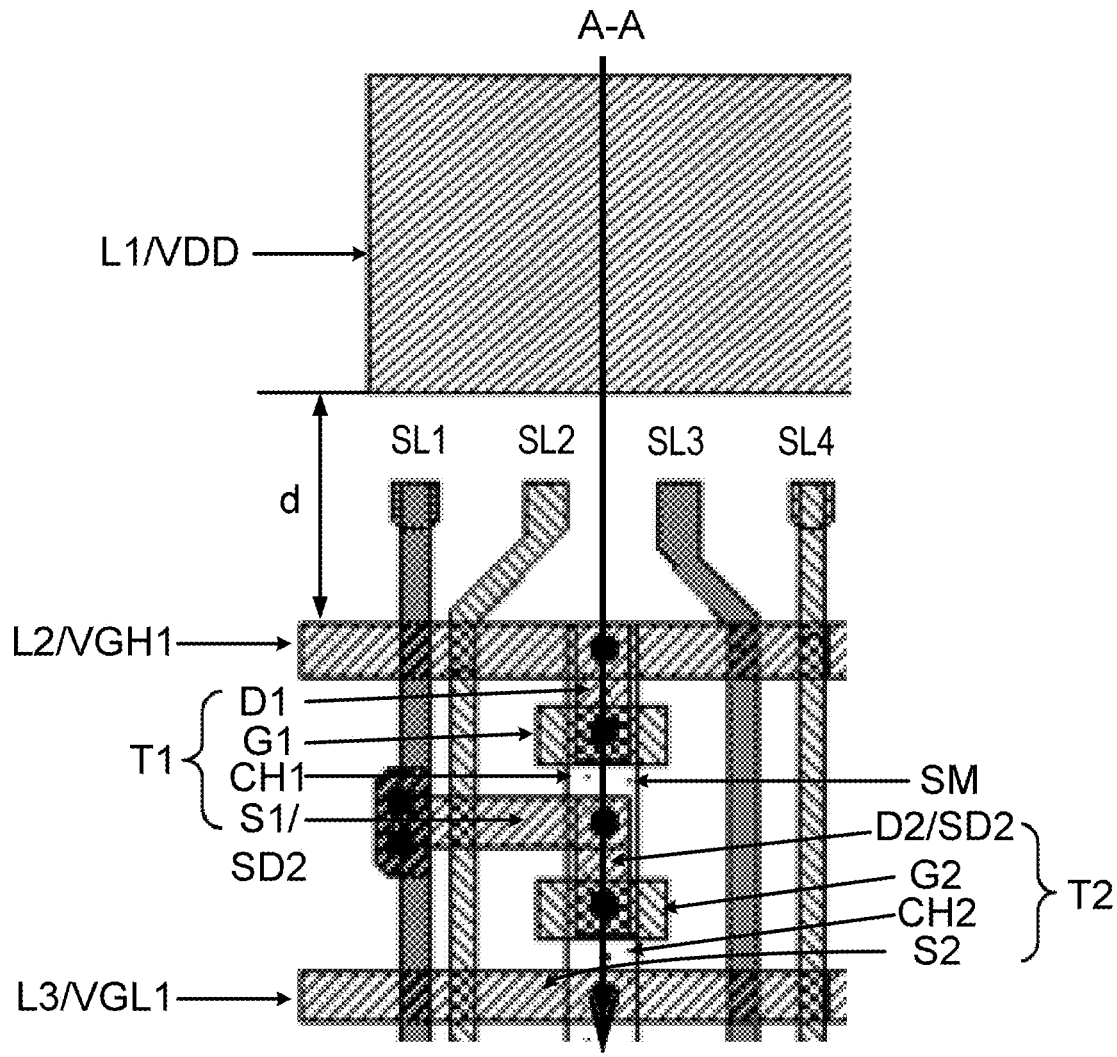
FIG. 9A is a partially enlarged schematic diagram of the anti-corrosion circuit shown in FIG. 7.
Figure 9B:
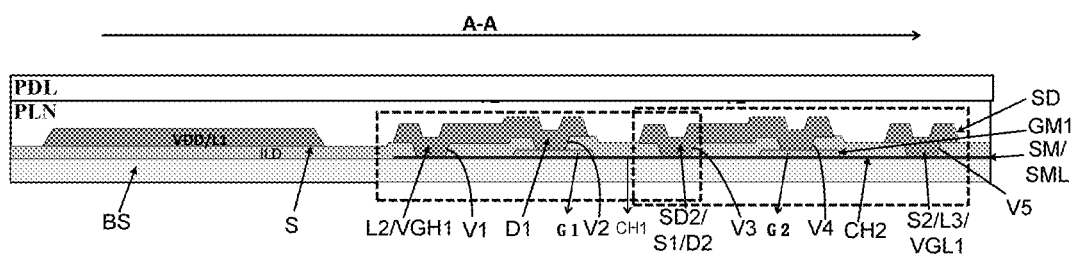
FIG. 9B is a cross-sectional schematic diagram along an A-A line in FIG. 9A.

FIG. 9A is a partially enlarged schematic diagram of the anti-corrosion circuit shown in FIG. 7; FIG. 9B is a cross-sectional schematic diagram along an A-A line in FIG. 9A. As shown in FIGS. 9A and 9B, in the anti-corrosion circuit provided by at least one embodiment of the present disclosure, the semiconductor layer SM, the first gate metal layer GM1, an insulating layer ILD and the source-drain metal layer SD are sequentially arranged on a base substrate BS. For example, as shown in FIG. 9B, the source-drain metal layer SD is covered by a planarization insulating layer PLN and a pixel definition layer PDL. For example, as shown in FIGS. 9A and 9B, the semiconductor line SML in the semiconductor layer SM includes a first channel CH1 and a second channel CH2. The first gate metal layer GM1 includes the first gate electrode G1 and the second gate electrode G2 provided side by side on the semiconductor layer SM. The source-drain metal layer SD includes the first signal line L1 (please refer to the first high voltage signal line VDD), the second signal line L2 (please refer to the second high voltage signal line VGH1) and the third signal line L3 (please refer to low voltage signal line VGL1) provided side by side on the surface S of the insulating layer ILD. The first switch T1 includes the first gate electrode G1, the first electrode S1, the second electrode D1, and the first channel CH1 located between the first electrode S1 and the second electrode D1. The second switch T2 includes the second gate electrode G2, the third electrode S2, the fourth electrode D2, and the second channel CH2 located between the third electrode S2 and the fourth electrode D2. In the direction from the first signal line L1 to the third signal line L3 (as indicated by the arrow A-A), the insulating layer ILD is sequentially provided with a first via hole V1 to a fifth via hole V5. The branch of the second signal line L2 protruding towards the third signal line L3 is electrically connected to the semiconductor line SML through the first via hole V1 and serves as the second electrode D1 of the first switch T1, and the second electrode D1 is electrically connected to the first gate electrode G1 through the second via hole V2. The first gate electrode G1 is directly and electrically connected to the semiconductor line SML at the second via V2 (that is, not electrically connected through the via hole). The relay element SD2 serves as the first electrode S1 of the first switch T1 and the fourth electrode D2 of the second switch T2 (that is, the relay element SD2 is the electrode shared by the first switch T1 and the second switch T2). The first electrode S1 and the fourth electrode D2 are electrically connected to the semiconductor line SML at the third via hole V3, and the relay element SD2 is electrically connected to the second gate electrode G2 at the fourth via hole V4. The second gate electrode G2 is directly and electrically connected to the semiconductor line SML at the fourth via V4 (that is, not electrically connected through the via hole), and the third signal line L3 serves as the third electrode S2 of the second switch T2.

For example, the source-drain metal layer SD includes an aluminum metal layer. For example, the source-drain metal layer includes the first metal layer M1, the second metal layer M2, and the third metal layer M3 as described above. For example, the first metal layer M1, the second metal layer M2, and the third metal layer M3 are respectively a titanium metal layer, an aluminum metal layer, and a titanium metal layer. Because the source-drain metal layer SD includes the first high voltage signal line VDD, the second high voltage signal line VGH, the low voltage signal line VGL and the relay element SD, the materials of these signal lines and the relay element SD are the same as that of the source-drain metal layer, which will not repeated here.

Figure 10C:
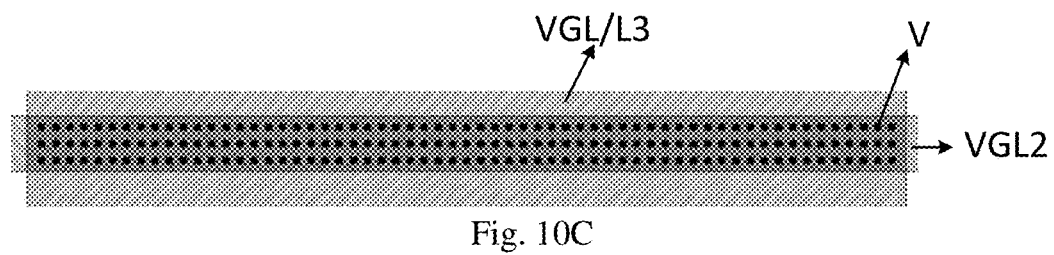
FIG. 10C is a partially enlarged schematic diagram of an area C in FIG. 10B.
Figure 10D:
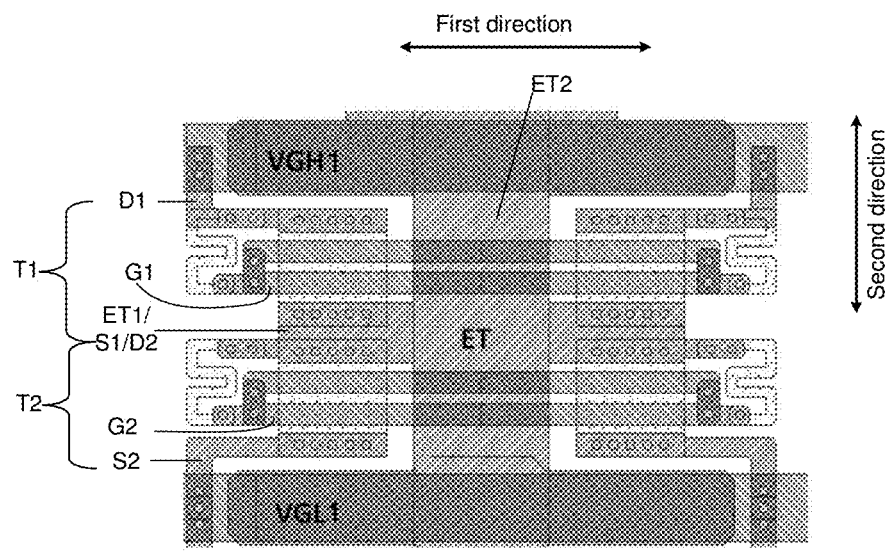
FIG. 10D is a partially enlarged schematic diagram of an area B in FIG. 10A.

FIG. 10A is another top view schematic diagram of the anti-corrosion circuit provided by the embodiments of the present disclosure. FIG. 10B is a partially enlarged schematic diagram of an area A in FIG. 10A. FIG. 10C is a partially enlarged schematic diagram of an area C in FIG. 10B. FIG. 10D is a partially enlarged schematic diagram of an area B in FIG. 10A.

For example, as shown in FIG. 10A, the anti-corrosion circuit AC provided by at least one embodiment of the present disclosure includes a high voltage signal line VGH, a reset voltage signal line Vinit, and a low voltage signal line that are sequentially arranged along the first direction and extend along the second direction, all these signal lines are input with a constant voltage during operation; the voltage of the high voltage signal line VGH is greater than the voltage of the low voltage signal line VGL, and the voltage of the reset voltage signal line Vinit is greater than the voltage of the low voltage signal line VGL. In the anti-corrosion circuit AC shown in FIG. 10A, the first sub-circuit C1 includes the reset voltage signal line Vinit, and the second sub-circuit C2 includes the high voltage signal line VGH and the low voltage signal line VGL; the high voltage signal line VGH is an example of the aforementioned first signal line L1, the reset voltage signal line Vinit is an example of the aforementioned second signal line L2, and the low voltage signal line VGL is an example of the aforementioned third signal line L3. It should be noted that the "high voltage" related to the high voltage signal line VGH means that the voltage of the high voltage signal line VGH is higher than the voltage of the low voltage signal line VGL; the "low voltage" related to the low voltage signal line VGL means that the voltage of the low voltage signal line VGL is lower than the voltage of the high voltage signal line VGH.

For example, as shown in FIG. 10A, the anti-corrosion circuit AC further includes a plurality of detection signal lines ET sequentially arranged along the first direction and extending along the second direction, and the detection signal lines ET are input with a change signal, such as a square wave signal, during operation. The high voltage signal line VGH is adjacent to one detection signal line ET, and the low voltage signal line VGL is adjacent to the other detection signal line ET. The anti-corrosion circuit AC further includes an electrostatic discharge protection circuit ESD for protecting the detection signal lines ET, and the high voltage signal line VGH, the low voltage signal line VGL, and the detection signal lines ET are all electrically connected to the electrostatic discharge protection circuit ESD.

For example, as shown in FIGS. 10A to 10C, the electrostatic discharge protection circuit ESD includes a plurality of sub-high voltage signal lines VGH1-VGH2 and a plurality of sub-low voltage signal lines VGL1-VGL2 alternately arranged, and these signal lines all extend along the first direction and arranged sequentially along the second direction. The plurality of sub-high voltage signal lines VGH1-VGH2 are electrically connected to the high voltage signal line VGH through, for example, a plurality of via holes V (see the black dots in FIG. 10C), and the plurality of sub-low voltage signal lines VGL1-VGL2 are electrically connected to the low voltage signal line VGH through, for example, the plurality of via holes V. In the electrostatic discharge protection circuit ESD shown in FIGS. 10A to 10C, the high voltage signal line VGH is an example of the aforementioned first bus signal line, and the low voltage signal line VGL is an example of the aforementioned second bus signal line, the sub-high voltage signal lines VGH1-VGH2 are examples of the aforementioned plurality of first sub-signal lines, and the plurality of low voltage signal lines VGL1-VGL2 are examples of the aforementioned plurality of second sub-signal lines. It should be noted that the "high voltage" related to the sub-high voltage signal line VGH1-VGH2 means that the voltages of these signal line are higher than the voltages of the sub-low voltage signal lines VGL1-VGL2; and the "low voltage" related to the sub-low voltage signal lines VGL1-VGL2 means that the voltages of these signal lines are lower than the voltages of the sub-high voltage signal lines VGH1-VGH2.

For example, as shown in FIGS. 10A and 10D, the electrostatic discharge protection circuit ESD includes a first switch T1, a protected detection signal line ET (an example of the aforementioned protected signal line), and a second switch T2. The detection signal line ET includes a first portion ET1 extending in the first direction and a second portion ET2 extending in the second direction. The first portion ET1 and the second portion ET2 are directly connected to each other, that is, the detection signal line ET is an integrated structure. The first switch T1 is a first transistor, and the first transistor includes a first gate electrode G1, a first electrode S1, and a second electrode DE The second switch T2 is a second transistor, and the second transistor includes a second gate electrode G2, a third electrode S2, and a fourth electrode D2. The second electrode D1 of the first switch T1 is electrically connected to the sub-high voltage signal line (please refer to VGH1) and the first gate electrode G1; the first portion ET1 of the detection signal line ET serves as the first electrode S1 of the first switch T1 and serves as the fourth electrode D2 of the second switch T2; the third electrode S2 of the second switch T2 is electrically connected to the sub-low voltage signal line (please refer to VGL1). For example, both the first transistor and the second transistor are P-type transistors. In the embodiments of the present disclosure, the positive-charge static electricity on the detection signal line ET is discharged to the sub-high voltage signal lines VGH1-VGH2 through the first switch T1, and then discharged outside through the sub-high voltage signal lines VGH1-VGH2; the negative-charge static electricity on the detection signal line ET is discharged to the sub-low voltage signal lines VGL1-VGL2 through the second switch T2, and then discharged outside through the sub-low voltage signal lines VGL1-VGL2. For the working principle of the electrostatic discharge protection circuit, please refer to the relevant description above, which will not be repeated here.

For example, the high voltage signal line VGH, the reset voltage signal line Vinit, the low voltage signal line VGH, and the detection signal line ET all belong to the source-drain metal layer, and these signal lines are all located side by side on the same surface. For example, the source-drain metal layer includes an aluminum metal layer. For example, the source-drain metal layers includes the first metal layer M1, the second metal layer M2, and the third metal layer M3 as described above. For example, the sub-high voltage signal lines VGH1-VGH2 and the sub-low voltage signal lines VGL1-VGL2 all belong to the gate metal layer (for example, the aforementioned first gate metal layer GM1).

For example, as shown in FIG. 10A, a gap between orthographic projections of the high voltage signal line VGH (an example of the first signal line L1) and the reset voltage signal line Vinit (an example of the second signal line L2)

on the same surface has a size h of less than or equal to 60 microns in the first direction. For example, the size h is less than or equal to 60 microns and greater than or equal to 50 microns. Because the distance between the high voltage signal line VGH and the reset voltage signal line Vinit is formed to be relatively smaller, the structure of the anti-corrosion circuit is compact and space-saving.

The embodiments of the present disclosure further provide an electronic device, which includes the anti-corrosion circuit described in any of the aforementioned embodiments.

Figure 11A:
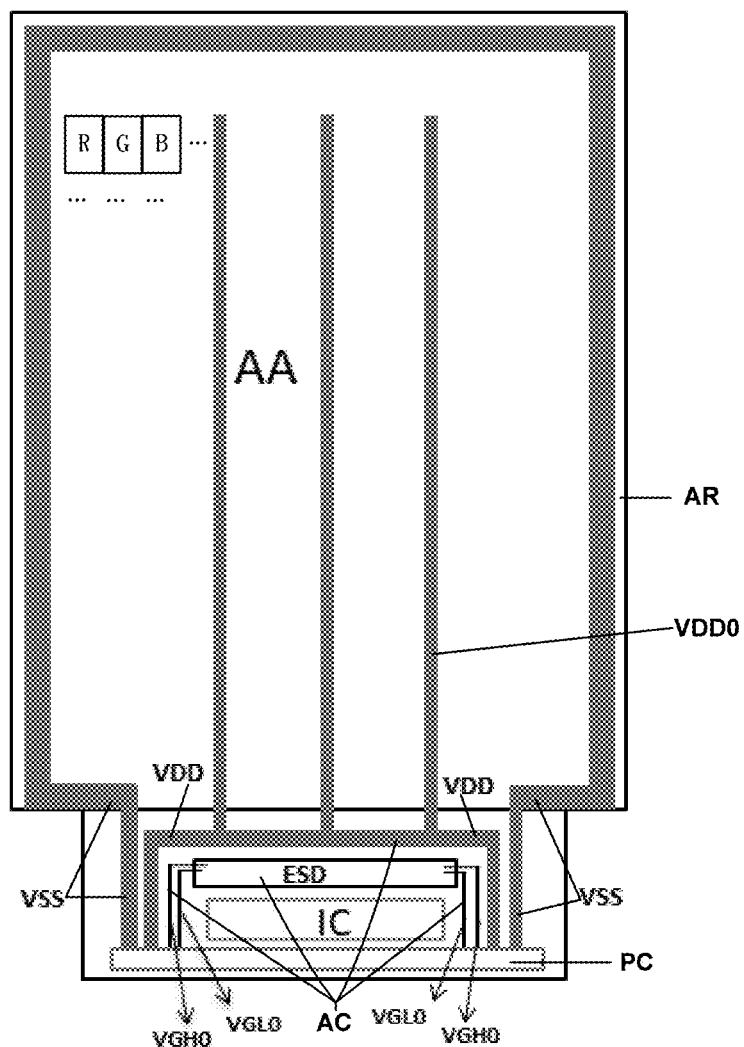
FIGS. 11A and 11B are top view schematic diagrams of an electronic device provided by the embodiments of the present disclosure.
Figure 11B:
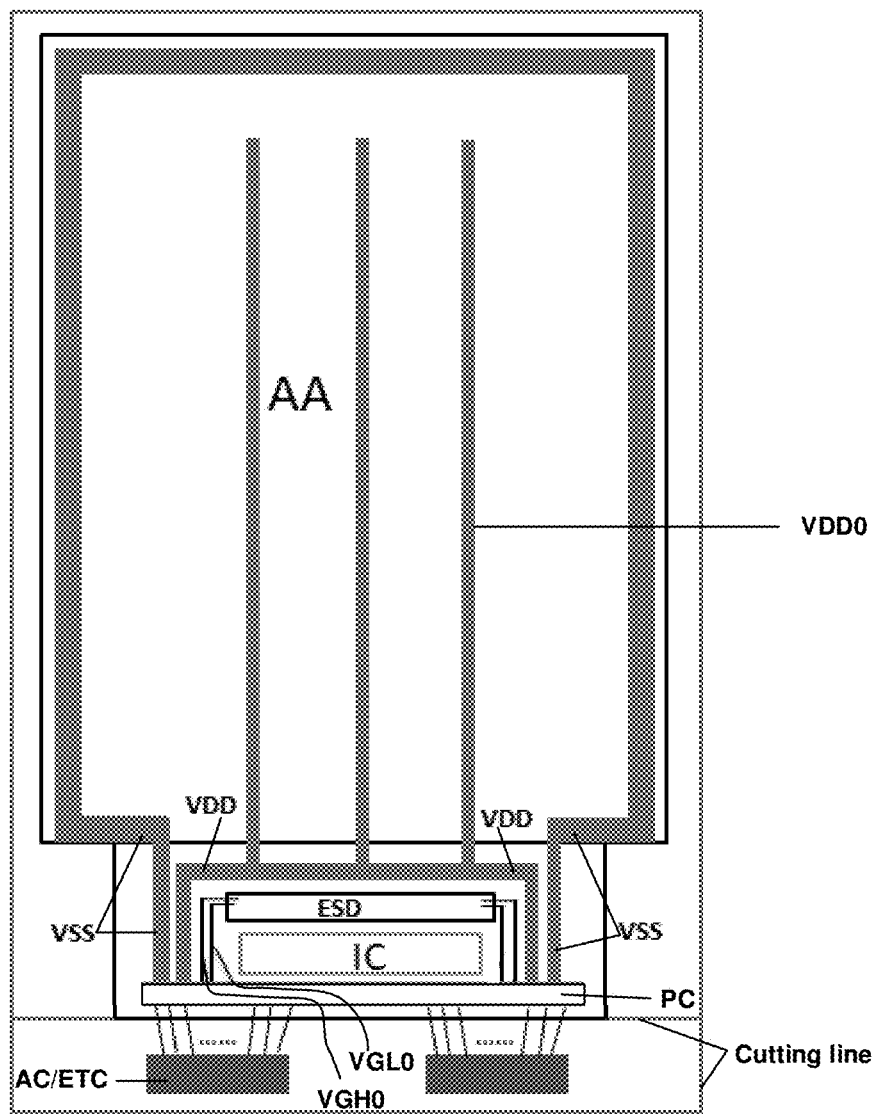

FIGS. 11A and 11B are top view schematic diagram of an electronic device provided by the embodiments of the present disclosure. For example, as shown in FIGS. 11A and 11B, the electronic device provided by at least one embodiment of the present disclosure includes a pixel substrate AR, a first power bus line VDD (that is, the first high voltage signal line in the embodiment shown in FIG. 7), a plurality of sub-power line VDD0 (only three sub-power supply lines are schematically drawn in the figure), a second power bus line VSS, an electrostatic discharge protection circuit ESD, a driving circuit IC, and a circuit board PC. The pixel substrate AR includes a plurality of sub-pixels (for example, each of the sub-pixels includes a light-emitting element), and the plurality of sub-pixels are arranged in a matrix. For example, the plurality of sub-pixels includes a red sub-pixel R, a green sub-pixel G, and a blue sub-pixel B, and these sub-pixels are located in a display area AA of the pixel substrate AR, so as to realize the display function. The first power bus line VDD is electrically connected to the sub-power line VDD0 to provide a first power signal to the sub-pixels (such as light-emitting elements) through the sub-power line VDD0, and the second power bus line VSS is used to provide a second power signal to the sub-pixels. The sub-pixel works under the action of the first power signal and the second power signal. For example, the first power bus line VDD provides the first power signal to a positive electrode of the light-emitting element in the sub-pixel, and the second power bus line VSS provides the second power signal to a negative electrode of the light-emitting element in the sub-pixel; in this situation, the constant voltage of the first power bus line VDD is greater than the constant voltage of the second power bus line VSS. The circuit board PC (which is, for example, a flexible printed circuit board) is connected to one side of the pixel substrate AR and is configured to provide signals to the first power bus line VDD and the second power bus line VSS.

For example, as shown in FIGS. 11A and 11B, the electrostatic discharge protection circuit ESD (hereinafter referred to as a first electrostatic discharge protection circuit) included in the electronic device is located between the pixel substrate AR and the circuit board PC. The first electrostatic discharge protection circuit ESD is adjacent to the first power bus line VDD. For example, the first electrostatic discharge protection circuit ESD is the electrostatic discharge protection circuit as shown in FIG. 7, that is, the first electrostatic discharge protection circuit ESD includes the plurality of second sub-high voltage signal lines VGH1-VGH3 and the plurality of low voltage signal lines VGL1-VGL2. The plurality of second sub-high voltage signal lines VGH1-VGH3 are electrically connected to the high voltage signal line VGH0 (an example of the aforementioned first bus signal line B1), and the plurality of low voltage signal lines VGL1-VGL2 are electrically connected to the low voltage signal line VGL0 (an example of the aforementioned second bus signal line B2). The circuit board PC is used to provide signals to the high voltage signal line VGH0 and the low voltage signal line VGL0, so as to provide signals to the plurality of second sub-high voltage signal lines VGH1-VGH3 and the plurality of low voltage signal lines VGL1-VGL2 of the first electrostatic discharge protection circuit ESD respectively. It should be noted that the "high voltage" related to the high voltage signal line VGH0 means that the voltage of the high voltage signal line VGH0 is higher than the voltage of the low voltage signal line VGL0; the "low voltage" related to the low voltage signal line VGL0 means that the voltage of the low voltage signal line VGL0 is lower than the voltage of the high voltage signal line VGH0.

In the embodiment shown in FIG. 11A, the anti-corrosion circuit AC includes the first power bus VDD, the high voltage signal line VGH0, the low voltage signal line VGL0, and the first electrostatic discharge protection circuit ESD. In this situation, the first power bus VDD is an example of the aforementioned first signal line L1, the high voltage signal line VGH0 is an example of the aforementioned first bus signal line B1, the low voltage signal line VGL0 is an example of the aforementioned second bus signal line B2, the second high voltage signal line VGH1 adjacent to the first power bus line VDD is an example of the aforementioned second signal line L2, and the low voltage signal line VGL1 adjacent to the second high voltage signal line VGH1 is an example of the aforementioned third signal line L3. In FIG. 11A, the second signal line L2 and the third signal line L3 are located between the circuit board PC and the pixel substrate AR, and the first signal line L1 is located on a side of the second signal line L2 facing towards the pixel substrate AR, that is, the first signal line L1 is located between the pixel substrate AR and the second signal line L2.

For example, as shown in FIG. 11B, the electronic device provided by at least one embodiment of the present disclosure further includes a detection circuit ETC, which is located on a side of the circuit board PC away from the pixel substrate AR, that is, the circuit board PC is located between the detection circuit ETC and the pixel substrate AR. For example, the detection circuit ETC is the anti-corrosion circuit as shown in FIGS. 10A to 10D, that is, the detection circuit ETC is an example of the aforementioned anti-corrosion circuit AC. In this situation, the detection circuit ETC includes the high voltage signal line VGH, the reset voltage signal line Vinit, the low voltage signal line VGL, the detection signal line ET, and the electrostatic discharge protection circuit (hereinafter referred to as the second electrostatic discharge protection circuit) ESD as shown in FIGS. 10A to 10D. For the arrangement of the second electrostatic discharge protection circuit ESD, please refer to the relevant description in the embodiment of the anti-corrosion circuit shown in FIGS. 10A to 10D. The high voltage signal line VGH is an example of the aforementioned first signal line L1, the reset voltage signal line Vinit is an example of the aforementioned second signal line L2, the low voltage signal line VGL is an example of the aforementioned third signal line L3; the first signal line L1 and the third signal line L3 are located on a side of the circuit board PC away from the pixel substrate AR, and the reset voltage signal line Vinit is used to electrically connect with the light-emitting element included in the pixel substrate AR to provide a reset voltage.

The electronic device provided by the embodiments of the present disclosure may be an active light-emitting element panel (for example, an OLED panel or a quantum dot panel) or other types of electronic devices including the aforementioned anti-corrosion circuit.

Taking the electronic device which serves as the active light-emitting element panel (in this situation, the light-emitting element is an OLED light-emitting element or a quantum dot light-emitting element) as an example, in the process of manufacturing the electronic device, the detection circuit ETC as shown in FIG. 11B is used to perform an electrical testing on the pixel substrate AR, and after the electrical testing is completed, the pixel substrate AR is cut along the cutting line in FIG. 11B to remove the detection circuit ETC, thereby obtaining the electronic device as shown in FIG. 11A.

For example, the electronic device provided by at least one embodiment of the present disclosure is an OLED panel that includes a plurality of sub-pixels, and each sub-pixel includes a light-emitting element and a driving circuit that drives the light-emitting element to emit light. For example, the driving circuit adopts a 6T1C or 7T1C or similar circuit structure, where T refers to a thin film transistor (abbreviated as TFT), and C refers to a capacitor. For example, in the case that the first electrostatic discharge protection circuit ESD is the electrostatic discharge protection circuit shown in FIG. 7, the first power bus line VDD is used to provide a signal to the TFT included in the driving circuit, and the source signal line SL in FIG. 7 (please refer to SL1-SL4) is electrically connected to another TFT included in the driving circuit, and the first electrostatic discharge protection circuit is used to discharge the static electricity on the source signal line SL. For example, in the case that the detection circuit ETC is the anti-corrosion circuit as shown in FIGS. 10A to 10D, the reset voltage signal line Vinit is used to provide a signal to the TFT included in the driving circuit, and the detection signal line ET is electrically connected to another TFT included in the driving circuit, and the second electrostatic discharge protection circuit is used to discharge the static electricity on the detection signal line ET.

For example, the electronic device provided by the embodiments of the present disclosure may be any product or component with display function, such as an OLED panel, a quantum dot panel, a mobile phone, a tablet computer, a television, a monitor, a notebook computer, a digital photo frame, a navigator, and the like.

Figure 12:
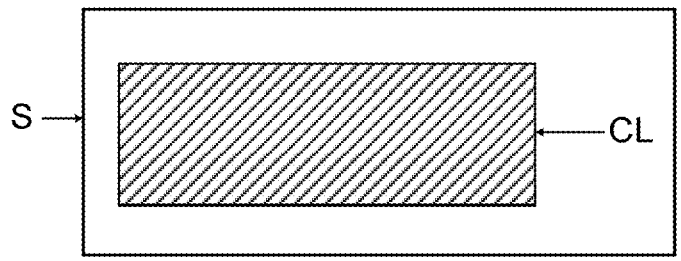
FIG. 12 is a schematic diagram of the formation of a conductive layer in a manufacturing method of the anti-corrosion circuit provided by the embodiments of the present disclosure.

The embodiments of the present disclosure further provide a manufacturing method of an anti-corrosion circuit, which includes: as shown in FIG. 12, forming a conductive layer CL on the surface S; and patterning the conductive layer CL to form the first signal line L1, the second signal line L2, and the third signal line L3 arranged sequentially in the first direction, as shown in FIG. 1. The first signal line L1, the second signal line L2, and the third signal line L3 all extend in the second direction, and the second direction is different from the first direction; the first signal line L1 and the third signal line L3 are both adjacent to the second signal line L2, the first signal line L1 and the second signal line L2 have the same electrical property, and the second signal line L2 and the third signal line L3 have different electrical properties.

For example, patterning the conductive layer CL comprises: coating a photoresist layer on the conductive layer CL; exposing the photoresist layer by using a mask plate; developing the exposed photoresist layer to form a photoresist pattern; thereafter, etching the conductive layer CL by using the photoresist pattern to obtain the first signal line L1, the second signal line L2 and the third signal line L3.

For example, the conductive layer CL includes an aluminum metal layer. For example, the conductive layer C1 includes a multilayer structure. For example, the multilayer structure includes the first metal layer M1, the second metal layer M2, and the third metal layer M3 as described above.

For example, the multilayer structure includes two stacked titanium metal layers and an aluminum metal layer sandwiched between the two.

At least one embodiment of the present disclosure further provides an array substrate. FIG. 13 is a top view schematic diagram of an array substrate provided by the embodiments of the present disclosure. The array substrate provided by at least one embodiment of the present disclosure includes a base substrate BS, a plurality of sub-pixels P, a plurality of source signal lines SL, a first power bus line VDD, a plurality of sub-power lines VDD0, and an electrostatic discharge protection circuit ESD. The base substrate BS includes a display area AA and a peripheral area PA on at least one side of the display area AA. The plurality of sub-pixels P are located in the display area AA. The plurality of source signal lines SL are located in the display area AA, extend along a first direction and are arranged sequentially along a second direction different from the first direction; the plurality of source signal lines SL are electrically connected to the plurality of sub-pixels P and are configured to provide data signal to the plurality of sub-pixels P. For example, each source signal line SL is electrically connected to a column of sub-pixels P to provide the data signal to the column of sub-pixels P. For example, the array substrate further includes a plurality of relay lines TL located in the peripheral area PA, and the plurality of relay lines TL are electrically connected to the plurality of source signal lines SL in one-to-one correspondence, so that the plurality of source signal lines SL are electrically connected to the electrostatic discharge protection circuit ESD respectively through the corresponding relay lines TL, thereby discharging static electricity through the electrostatic discharge protection circuit ESD. The first power bus line VDD is located in the peripheral area PA and includes a main body portion extending in the second direction. For example, the first power bus line VDD further includes an extension portion extending from both two ends of the main body portion and extending along the first direction. The plurality of sub-power lines VDD0 are located in the display area AA and are electrically connected to the plurality of sub-pixels P respectively, and the plurality of sub-power lines VDD0 are configured to provide the plurality of sub-pixels P with first power signal. For example, each sub-power line VDD0 is electrically connected to the column of sub-pixels P to provide the first power signal to the column of sub-pixels P. The first power bus line VDD is electrically connected to the plurality of sub-power lines VDD0 to provide the first power signal to the sub-pixels P through the plurality of sub-power lines VDD0. That is, the first power bus VDD0 provides the first power signal to the plurality of sub-power lines VDD0, and the plurality of sub-power lines VDD0 provide the first power signal to the plurality of sub pixels P. The electrostatic discharge protection circuit ESD is located on a side of the main body portion of the first power bus line VDD away from the display area AA (that is, the main body portion is located between the display area AA and the electrostatic discharge protection circuit ESD); the electrostatic discharge protection circuit ESD is electrically connected to the plurality of sources signal lines SL and includes a plurality of first sub-signal lines VGH (FIG. 13 shows VGH1 and VGH2 for illustration) and a plurality of second sub-signal lines VGL (FIG. 13 shows VGL1 and VGL2 for illustration); the plurality of first sub-signal lines VGH and the plurality of second sub-signal lines VGL extend along the second direction and are alternately arranged along the first direction; the main body portion of the first power bus line VDD is adjacent to one first sub-signal line VGH1, and the electrical property of the first power bus line VDD (that is, the main body portion of the first power bus line VDD) is the same as the electrical property of the first sub-signal line (please refer to VGH1).

For example, as shown in FIG. 13, the array substrate provided by at least one embodiment of the present disclosure further includes a second power bus line VSS. The second power bus VSS is located in the peripheral area PA and is configured to provide a second power signal to the plurality of sub-pixels P. For example, the sub-pixel P includes a light-emitting element, the light-emitting element includes a positive electrode and a negative electrode, the first power bus line VDD is configured to apply the first power signal to the positive electrode of the light-emitting element, and the second power bus line VSS is configured to apply the second power signal to the negative electrode of the light-emitting element.

For example, the array substrate further includes a circuit board PC (such as a printed circuit board), such as a flexible circuit board FPC, which is configured to provide the first power signal to the first power bus line VDD and the second power signal to the second power bus line VSS.

In the embodiments of the present disclosure, the main body portion of the first power bus line VDD is adjacent to the first sub-signal line VGH1 and has the same electrical property as the first sub-signal line VGH1, which is beneficial to avoid electrochemical corrosion between the main body portion of the first power bus line VDD and the first sub-signal line VGH1 adjacent thereto (especially under the condition of high temperature and high humidity). In some embodiments, because electrochemical corrosion is not prone to occur between the main body portion of the first power bus line VDD and the first sub-signal line VGH1 adjacent thereto, the distance between the main body portion of the first power bus line VDD and the first sub-signal line VGH1 adjacent thereto can be designed to be smaller to narrow the frame (for example, the lower frame) of the panel, thereby increasing the screen-to-body ratio. Thus, some embodiments of the present disclosure can achieve the narrow frame design and alleviate localized short circuit or open circuit at the same time.

It should be noted that in the embodiments of the present disclosure, the main body portion of the first power bus line VDD being adjacent to the first sub-signal line VGH1 means that the main body portion and the first sub-signal line VGH1 extend in the same direction, and there is no other signal line extending in the same direction between the main body portion and the first sub-signal line VGH1.

For example, the first sub-signal line VGH1 and the second sub-signal line VGL1 adjacent to the first sub-signal line VGH1 have opposite electrical properties. That is, in the case that the first sub-signal line VGH1 and the second sub-signal line VGL1 have opposite electrical properties, the first sub-signal line VGH1 having the same electrical property as that of the first power bus line VDD is arranged to be adjacent to the first power bus line VDD.

For example, the main body portion of the first power bus line VDD extending in the second direction is the aforementioned first signal line L1, and the first sub-signal line VGH1 adjacent to the main body portion is the aforementioned second signal line L2, the second sub-signal line VGL2 adjacent to the first sub-signal line VGH1 is the aforementioned third signal line L3. For example, the absolute value of the voltage difference between the first signal line L1 and the second signal line L2 is smaller than the absolute value of the voltage difference between the first signal line L1 and the third signal line L3. In the case that the first signal line L1 and the second signal line L2 have the same electrical property, it is beneficial to further avoid electrochemical corrosion between the main body portion of the first power bus line VDD and the first sub-signal line VGH1 adjacent thereto by setting the absolute value of the voltage difference between the first signal line L1 and the second signal line L2 being smaller than the absolute value of the voltage difference between the first signal line L1 and the third signal line L3.

For example, the voltage of the first signal line L1, the voltage of the second signal line L2, and the voltage of the third signal line L3 are all constant voltages.

For example, the first signal line L1, the second signal line L2, and the third signal line L3 are located side by side on the same surface S, as shown in FIG. 1.

For example, both the first signal line L1 and the second signal line L2 have positive electrical property, and the third signal line L3 has negative electrical property. Alternatively, for example, both the first signal line L1 and the second signal line L2 have negative electrical properties, and the third signal line L3 has positive electrical property.

For example, at least one of the main body portion of the first power bus line VDD extending in the second direction and the first sub-signal line VGH1 adjacent thereto includes an aluminum metal layer.

For example, at least one of the main body portion of the first power bus line VDD and the first sub-signal line VGH1 has a multilayer structure, as shown in FIG. 2. The multilayer structure includes a first metal layer M1, a second metal layer M2 and a third metal layer M3 stacked sequentially, and the metal activity of the second metal layer M2 is greater than that of the first metal layer M1 and that of the third metal layer M3.

For example, the size of the gap between the main body portion of the first power bus VDD and the first sub-signal line VGH1 is less than or equal to 300 microns in the first direction.

For example, the electrostatic discharge protection circuit ESD further includes a first bus signal line B1 and a second bus signal line B2, the plurality of first sub-signal lines (please refer to VGH1-VGH2) are electrically connected to the first bus signal line B1, and the plurality of second sub-signal lines (please refer to VGL1-VGL2) are electrically connected to the second bus signal line B2. For example, the first bus signal line B1 and the second bus signal line B2 respectively receive different signals from the circuit board PC. For example, the first bus signal line B1 and the second bus signal line B2 are the high voltage signal line VGH0 and the low voltage signal line VGL0 in the embodiment shown in FIGS. 11A and 11B, respectively.

For example, the electrostatic discharge protection circuit ESD includes a plurality of switch groups T0, each switch group T0 includes a first switch T1 and a second switch T2 sharing the same electrode, the first switch T1 and the second switch T2 are electrically connected to the same source signal line SL through the same shared electrode to discharge the static electricity on the source signal line SL, and different switch groups T0 are electrically connected to different source signal lines SL. For example, for the connection relationship between the first switch T1 and the second switch T2, please refer to the description related to FIGS. 5A to 6.

For example, the first switch T1 includes a first input terminal Vi1 and a first output terminal Vo1, the first input terminal Vi1 is electrically connected to the same source signal line SL, and the first output terminal Vo1 is electrically connected to the second signal line L2; the second switch T2 includes a second input terminal Vi2 and a second output terminal Vo2. The second input terminal Vi2 is electrically connected to the third signal line L3, and the second output terminal Vo2 is electrically connected to the same source signal line SL.

For example, the first switch T1 is a first transistor, the first transistor includes a first gate electrode G1, a first electrode S1 and a second electrode D1, the first electrode S1 serves as the first input terminal Vi1, and the second electrode D1 is electrically connected to the first gate electrode G1 and serves as the first output terminal Vo1. The second switch T2 is a second transistor, the second transistor includes a second gate electrode G2, a third electrode S2 and a fourth electrode D2, the third electrode S2 serves as the second input terminal Vi2, and the fourth electrode D2 is electrically connected to the second gate electrode G2 and serves as the second output terminal Vo2.

For example, the source signal line SL and the electrostatic discharge protection circuit ESD adopt the embodiment shown in FIG. 7. In this situation, the main body portion of the first power bus line VDD is the first high voltage in the embodiment shown in FIG. 7.

For example, as shown in FIG. 7, the plurality of source signal lines SL include signal line groups arranged sequentially in a second direction, each of the signal line groups includes a first source signal line SL1, a second source signal line SL2, a third source signal line SL3 and a fourth source signal line SL4 arranged sequentially in the second direction. The electrostatic discharge protection circuit ESD includes a plurality of switch groups T0, which includes the first switch group T01, the second switch group T02, the third switch group T03 and the fourth switch group T04 arranged sequentially along the first direction. The first switch group T01 is electrically connected to the first source signal line SL1 to release static electricity on the first source signal line SL1. The second switch group T02 is adjacent to the first switch group T01 and is electrically connected with the second source signal line SL2 to release static electricity on the second source signal line SL2. The third switch group T03 is adjacent to the second switch group T02 and is electrically connected with the third source signal line SL3 to release static electricity on the third source signal line SL3. The fourth switch group T04 is adjacent to the third switch group T03 and is electrically connected with the fourth source signal line SL4 to release static electricity on the fourth source signal line SL4.

Figure 14:
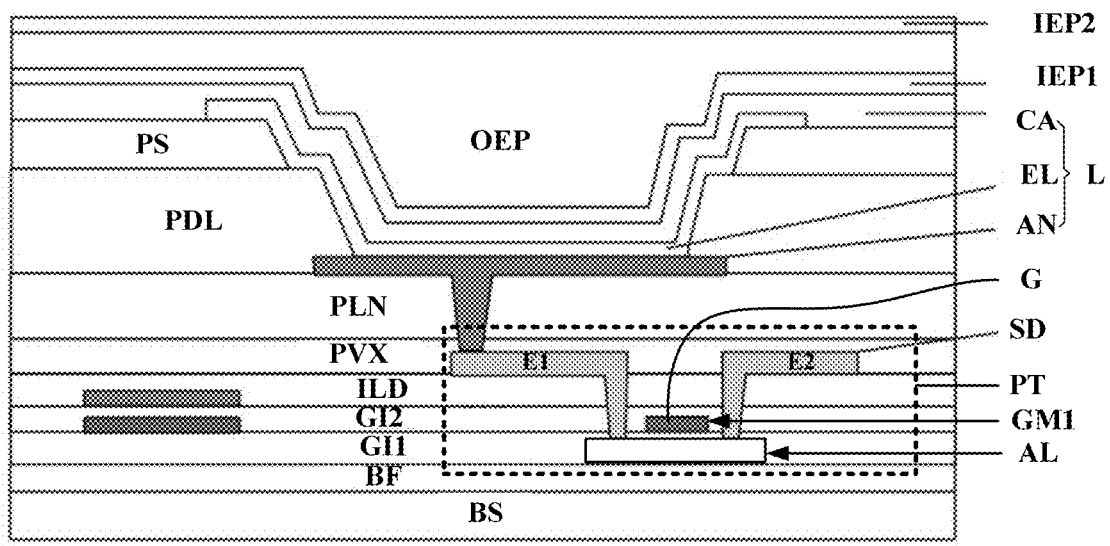
FIG. 14 is a partially cross-sectional schematic diagram in a display area of the array substrate provided by the embodiments of the present disclosure.

For example, a partially cross-sectional schematic diagram of each layer structure in the display area of the array substrate refers to FIG. 14, and a top view schematic diagram of each layer structure in the peripheral area PA of the array substrate refers to FIG. 7 to FIG. 8C. For example, as shown in FIGS. 7 and 14, the array substrate includes a first gate metal layer GM1, a second gate metal layer GM2, and a source-drain metal layer SD sequentially located on the base substrate BS. The first gate metal layer GM1 includes a part of the plurality of source signal lines SL (for example, includes the plurality of second source signal lines SL2 and the plurality of fourth source signal lines SL4 as shown in FIGS. 7 and 8B); the second gate metal layer includes the other part of the plurality of source signal lines SL (for example, includes the plurality of first source signal lines SL1 and the plurality of third source signal lines SL3 as shown in FIGS. 7 and 8C); the source-drain metal layer SD includes the main body portion of the first power bus line VDD extending in the second direction, the plurality of sub-power lines VDD0, the plurality of first sub-signal lines VGH (please refer to VGH1-VGH2), and the plurality of second sub-signal lines VGL (please refer to VGL1-VGL2). For example, the source-drain metal layer SD does not include the relay lines TL, that is, the relay lines TL are located outside the source-drain metal layer SD to prevent the relay lines TL from being electrically connected to the main body portion of the first power bus line VDD. For example, the relay lines TL are located in the first gate metal layer GM1 or the second gate metal layer GM2.

For example, as shown in FIG. 14, at least one sub-pixel of the array substrate provided by at least one embodiment of the present disclosure includes a plurality of pixel switches PT (FIG. 14 only shows one pixel switch PT for illustration). The pixel switch PT is electrically connected to the light-emitting element in the sub-pixel, and each pixel switch PT includes an active layer AL, a gate electrode G, a first electrode E1 and a second electrode E2, one of the first electrode E1 and the second electrode E2 is a source electrode and the other is a drain electrode. For example, the active layer AL is located in the aforementioned semiconductor layer SM, the gate electrode G is located in the first gate metal layer GM1 or the second gate metal layer GM2, and the first electrode E1 and the second electrode E2 are both located in the source-drain metal layer SD. For example, the active layer AL is located on a buffer layer BF which is on the base substrate BS and is covered by a first gate insulating layer GI1; the gate electrode G is located on the first gate insulating layer GI1 and is covered sequentially by the second gate insulating layer GI2 and the insulating layer ILD; the first electrode E1 and the second electrode E2 of the pixel switch PT are located on the insulating layer ILD and are covered sequentially by the passivation insulating layer PVX and the planarization insulating layer PLN.

For example, as shown in FIG. 14, the light-emitting element L includes a positive electrode AN, a light emitting layer EL, and a negative electrode CA, and the positive electrode AN of the light-emitting element L is electrically connected to the first electrode E1 of the pixel switch PT. For example, the positive electrode AN of the light-emitting element L is electrically connected to the first electrode E1 of the pixel switch PT through a via hole penetrating the passivation insulating layer PVX and the planarization insulating layer PLN. For example, two adjacent light-emitting elements L are spaced apart from each other by the pixel definition layer PDL. In some embodiments, the pixel definition layer PDL is further provided with an organic layer PS including a plurality of spacers to better separate the two adjacent light-emitting elements L.

For example, the array substrate provided by at least one embodiment of the present disclosure further includes an encapsulation layer for encapsulating the light-emitting elements L. The encapsulation layer includes inorganic encapsulation layers IEP1 and IEP2 and an organic encapsulation layer OEP located between the inorganic encapsulation layers IEP1 and IEP2. In other embodiments, the encapsulation layer may include a plurality of organic encapsulation layers and a plurality of inorganic encapsulation layers, and the plurality of organic encapsulation layers and the plurality of inorganic encapsulation layers are alternately arranged.

In the anti-corrosion circuit and the manufacturing method thereof, the array substrate and the electronic device provided by the embodiments of the present disclosure, the same components in the embodiments may have the same arrangement.

The foregoing embodiments merely are exemplary embodiments of the disclosure, and not intended to define the scope of the disclosure, and the scope of the disclosure is determined by the appended claims.

The invention claimed is:

1. An array substrate, comprising:
a base substrate, comprising a display area and a peripheral area provided on at least one side of the display area;
a plurality of sub-pixels, provided in the display area;
a plurality of source signal lines, provided in the display area and electrically connected to the plurality of sub-pixels respectively, and the plurality of source signal lines being configured to provide data signal to the plurality of sub-pixels, wherein the plurality of source signal lines extend along a first direction and arranged sequentially along a second direction different from the first direction;
a first power bus line, provided in the peripheral area and comprising a main body portion extending along the second direction;
a plurality of sub-power lines, provided in the display area and electrically connected to the plurality of sub-pixels respectively, and the plurality of sub-power lines being configured to provide first power signal to the plurality of sub-pixels, wherein the first power bus line is connected to the plurality of sub-power lines;
an electrostatic discharge protection circuit, provided on a side of the main body portion of the first power bus line away from the display area and electrically connected to the plurality of source signal lines, and comprising a plurality of first sub-signal lines and a plurality of second sub-signal lines, wherein the plurality of first sub-signal lines and the plurality of second sub- signal lines extend along the second direction and are alternately arranged along the first direction, and the main body portion of the first power bus line is adjacent to one first sub-signal line, and electrical property of the first power bus line is the same as electrical property of the one first sub- signal line.

2. The array substrate according to claim 1, wherein the electrostatic discharge protection circuit further comprises a first bus signal line and a second bus signal line, the plurality of first sub-signal lines are electrically connected to the first bus signal line, and the plurality of second sub-signal lines are electrically connected to the second bus signal line.

3. The array substrate according to claim 1, wherein the electrostatic discharge protection circuit comprises a plurality of switch groups, each switch group comprises a first switch and a second switch sharing a same electrode, the first switch and the second switch are electrically connected to a same source signal line through the same shared electrode, and different switch groups are electrically connected to different source signal lines.

4. The array substrate according to claim 3, wherein the main body portion of the first power bus line is a first signal line, and the one first sub-signal line adjacent to the main body portion is a second signal line, and the second sub-signal line adjacent to the second signal line is a third signal line;
the first switch comprises a first input terminal and a first output terminal, the first input terminal is electrically connected to the same source signal line, and the first output terminal is electrically connected to the second signal line;
the second switch comprises a second input terminal and a second output terminal, the second input terminal is electrically connected to the third signal line, and the second output terminal is electrically connected to the same source signal line.

5. The array substrate according to claim 4, wherein
the first switch is a first transistor, the first transistor comprises a first gate electrode, a first electrode, and a second electrode, the first electrode serves as the first input terminal, and the second electrode is electrically connected to the first gate electrode and serves as the first output terminal;
the second switch is a second transistor, the second transistor comprises a second gate electrode, a third electrode, and a fourth electrode, the third electrode serves as the second input terminal, and the fourth electrode is electrically connected to the second gate electrode and serves as the second output terminal.

6. The array substrate according to claim 4, wherein both the first signal line and the second signal line have positive electrical property, and the third signal line has negative electrical property.

7. The array substrate according to claim 4, wherein both the first signal line and the second signal line have negative electrical property, and the third signal line has positive electrical property.

8. The array substrate according to claim 4, wherein a voltage of the first signal line, a voltage of the second signal line, and a voltage of the third signal line are all constant voltages.

9. The array substrate according to claim 4, wherein the first signal line, the second signal line and the third signal line are provided side by side on a same surface.

10. The array substrate according to claim 3, wherein
the plurality of source signal lines comprise signal line groups arranged sequentially along the second direction, and each of the signal line groups comprises a first source signal line, a second source signal line, a third source signal line, and a fourth source signal line arranged sequentially in the second direction;
the plurality of switch groups of the electrostatic discharge protection circuit comprise a first switch group, a second switch group, a third switch group, and a fourth switch group that are arranged sequentially along the first direction, the first switch group is electrically connected to the first source signal line, the second switch group is electrically connected to the second source signal line, the third switch group is electrically connected to the third source signal line, and the fourth switch group is electrically connected to the fourth source signal line.

11. The array substrate according to claim 1, wherein
the array substrate comprises a first gate metal layer, a second gate metal layer, and a source- drain metal layer provided sequentially on the base substrate;
the first gate metal layer comprises a part of the plurality of source signal lines;
the second gate metal layer comprises the other part of the plurality of source signal lines;
the source-drain metal layer comprises the main body portion of the first power bus line, the plurality of sub-power lines, the plurality of first sub-signal lines, and the plurality of second sub-signal lines.

12. The array substrate of claim 11, wherein
at least one of the plurality of sub-pixels comprises a plurality of pixel switches;
each pixel switch comprises a gate electrode, a first electrode and a second electrode;
the gate electrode is provided in the first gate metal layer or the second gate metal layer, and the first electrode and the second electrode are provided in the source-drain metal layer.

13. The array substrate according to claim 1, wherein at least one of the main body portion of the first power bus line and the one first sub-signal line comprises aluminum metal.

14. The array substrate according to claim 1, wherein at least one of the main body portion of the first power bus line and the one first sub-signal line is a multilayer structure, the multilayer structure comprises a first metal layer, a second metal layer, and a third metal layer stacked sequentially, and a metal activity of the second metal layer is greater than metal activities of the first metal layer and the third metal layer.

15. The array substrate according to claim 1, wherein a voltage of the main body portion of the first power bus line and a voltage of the one first sub-signal line are both constant voltages.

16. The array substrate according to claim 1, wherein a size of a gap between the main body portion of the first power bus line and the one first sub-signal line is less than or equal to 300 microns in the first direction.

17. The array substrate according to claim 1, further comprising a second power bus line, wherein the second power bus line is provided in the peripheral area and is configured to provide second power signal to the plurality of sub-pixels.

18. An electronic device, comprising the array substrate according to claim 1.

* * * * *